(12) United States Patent
Kita

(10) Patent No.: US 8,071,946 B2
(45) Date of Patent: Dec. 6, 2011

(54) MULTI-FUNCTION LIGHT SENSOR

(75) Inventor: Yukihiro Kita, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/461,090

(22) Filed: Jul. 31, 2009

(65) Prior Publication Data
US 2010/0032569 A1  Feb. 11, 2010

(30) Foreign Application Priority Data
Aug. 8, 2008 (JP) .................................. 2008-205871

(51) Int. Cl.
*H01L 27/14* (2006.01)
(52) U.S. Cl. ................................................... 250/338.4
(58) Field of Classification Search ............... 250/214.1, 250/226, 338.4, 372, 339.1; 257/436, 440, 257/464
See application file for complete search history.

(56) References Cited

U.S. PATENT DOCUMENTS

| 5,726,440 A * | 3/1998 | Kalkhoran et al. | 250/214.1 |
| 2002/0011570 A1* | 1/2002 | Castleman | 250/339.15 |
| 2006/0270096 A1* | 11/2006 | Brady et al. | 438/73 |
| 2008/0067330 A1* | 3/2008 | Yamamoto | 250/226 |

FOREIGN PATENT DOCUMENTS

| JP | 2001-352094 A | 12/2001 |
| JP | 2004-104084 A | 4/2004 |

* cited by examiner

*Primary Examiner* — David Porta
*Assistant Examiner* — Marcus Taningco
(74) *Attorney, Agent, or Firm* — Rabin & Berdo, P.C.

(57) ABSTRACT

The light sensor according to an exemplary embodiment of the present invention is a multi-function light sensor that is equipped at low cost with both an ultraviolet light sensor and a visible light sensor and suppresses leak current between adjacent elements on the same substrate. The light sensor is equipped with a SOI substrate, formed from a silicon oxide insulating film and a silicon semiconductor layer made up from single crystal silicon, on a silicon substrate. Photodiodes PD1 and PD2 are formed on the silicon substrate, and a photodiode UV-PD, and main portions (source, drain and channel regions) of a MOSFET configuring a control circuit, are formed in the silicon semiconductor layer on the insulating film.

11 Claims, 23 Drawing Sheets

MULTI-FUNCTION LIGHT SENSOR

CROSS-REFERENCE TO RELATED APPLICATION

This application claims priority under 35 USC 119 from Japanese Patent Application No. 2008-205871 filed on Aug. 8, 2008, the disclosure of which is incorporated by reference herein.

BACKGROUND

1. Technical Field

The present invention relates to a multi-function light sensor.

2. Related Art

An illumination intensity sensor is a light sensor that detects illumination. Use can be made thereof, for example, for adjusting the brightness of a display, or switching light sources on or off, according to the peripheral illumination. Spectral sensitivity characteristics close to human spectral sensitivity is therefore required for illumination intensity sensors. Human spectral sensitivity can be represented as a relative spectral sensitivity curve having a peak between wavelengths of 500 nm and 600 nm.

Silicon photodiodes are most generally used for light receiving elements. The spectral sensitivity of silicon photodiodes generally has a peak at wavelengths of 600 nm to 700 nm, with sensitivity spreading out in a wide distribution to wavelengths from 300 nm to 1100 nm. Therefore when silicon photodiodes are used as illumination intensity sensors spectral sensitivity correction must be performed.

For example, one method of spectral sensitivity correction is, as shown in FIGS. 20A and 20B, to prepare a standard silicon photodiode "PD1" and a photodiode with sensitivity on the infrared side "PD2", and to take the difference between the respective photoreceptor currents. Spectral sensitivity characteristics can be obtained that are close to human spectral sensitivity by calculating the difference of each of the photoreceptor currents, as shown in FIG. 20C.

As a method of element isolation (separation) between adjacent light receiving elements, a method is proposed in Japanese Patent Application Laid-Open (JP-A) No. 2001-352094 to prevent occurrence of cross-talk due to leak current by forming a trench groove for element isolation after forming pn junctions. In order to address the same objective JP-A No. 2004-104084 proposes a configuration with a circuit interposed between an AF photodiode and an AE photodiode in a camera Auto Focus (AF) sensor installed with an Auto Exposure (AE) function.

In order to develop a multi-function light sensor at low cost, the present inventor has invented a light sensor device equipped with both an ultraviolet light sensor and a visible light sensor. An example of such a device is shown in FIGS. 21A and 21B. As shown in the figures, this device has a light receiving element "PD1" and a light receiving element "PD2" formed adjacent to each other on a silicon substrate as visible light sensors. As an ultraviolet sensor, a light receiving element "UV-PD" is formed in a semiconductor layer that is formed on the silicon substrate with an insulating film, such as a silicon oxide film etc., interposed between the silicon substrate and the semiconductor layer.

Namely, the ultraviolet light sensor is formed on a semiconductor layer of a so-called SOI structure. A light sensor device equipped with both an ultraviolet light sensor and visible light sensors can be obtained by fabricating the light receiving element PD1 and light receiving element PD2 on the same silicon substrate as the light receiving element UV-PD, with an insulating film interposed in this manner therebetween.

There is a need to simplify device structure and to suppress the chip surface area to a small amount, in particular when considering providing the above light sensor device at low cost. There is room for improvement with respect to these points in the light sensor device shown in FIGS. 21A and 21B. For example, the light receiving element PD1 and the light receiving element PD2 are formed adjacent to each other on the silicon substrate, however when the light receiving element PD1 and the light receiving element PD2 are formed adjacently in order to reduce the chip surface area, a problem arises in that a leak current flows between the adjacent light receiving element PD1 and light receiving element PD2 due to the silicon substrate being a semiconductor.

When a leak current flows between adjacent photodiodes, then dark current when there is no incident light cannot be measured. Namely, since the leak current flows irrespective of whether or not there is incident light, the light sensor becomes unable to fulfill its role of light detection. In practice therefore, a multi-function light sensor cannot be provided at low cost.

However, a structure in which a trench groove is formed in the silicon substrate, as in JP-A No. 2001-352094, cannot be adopted due to the limitation that the fabricating process would become complicated. In addition, a structure in which a transistor is disposed on the silicon substrate between the light receiving element PD1 and the light receiving element PD2 could be considered, as in JP-A No. 2004-104084, however, even if leak current between the light receiving element PD1 and the light receiving element PD2 is stopped, there is concern that leak current would occur between the transistor and the light receiving elements.

SUMMARY

The present invention is achieved to address the above problems, and an objective of the present invention is to provide a multi-function light sensor at low cost that can suppress leak current between adjacent elements on the same substrate, and is equipped with both an ultraviolet light sensor and a visual light sensor.

In order to achieve the above objective, the light sensor of the present invention includes: a first light receiving element having sensitivity to ultraviolet light, the first light receiving element being formed on a silicon semiconductor layer of an SOI substrate provided with a silicon substrate, an insulating film formed on the silicon substrate, and the silicon semiconductor layer formed on the insulating film; a second light receiving element having sensitivity to visible light or infrared light, the second light receiving element being formed on the silicon substrate along the surface direction of a main face of the SOI substrate in a second region that is adjacent to a first region where the first light receiving element is formed; and a third light receiving element having sensitivity to visible light or infrared light, the third light receiving element being formed on the silicon substrate along the surface direction in a third region that is adjacent to the first region formed with the first light receiving element and that is separated by a predetermined separation distance from the second region.

BRIEF DESCRIPTION OF THE DRAWINGS

Exemplary embodiments of the present invention will be described in detail based on the following figures, wherein.

DETAILED DESCRIPTION

Explanation will now be given of an exemplary embodiment of the present invention with reference to the drawings.

First Exemplary Embodiment

Light Sensor

Figure 1:
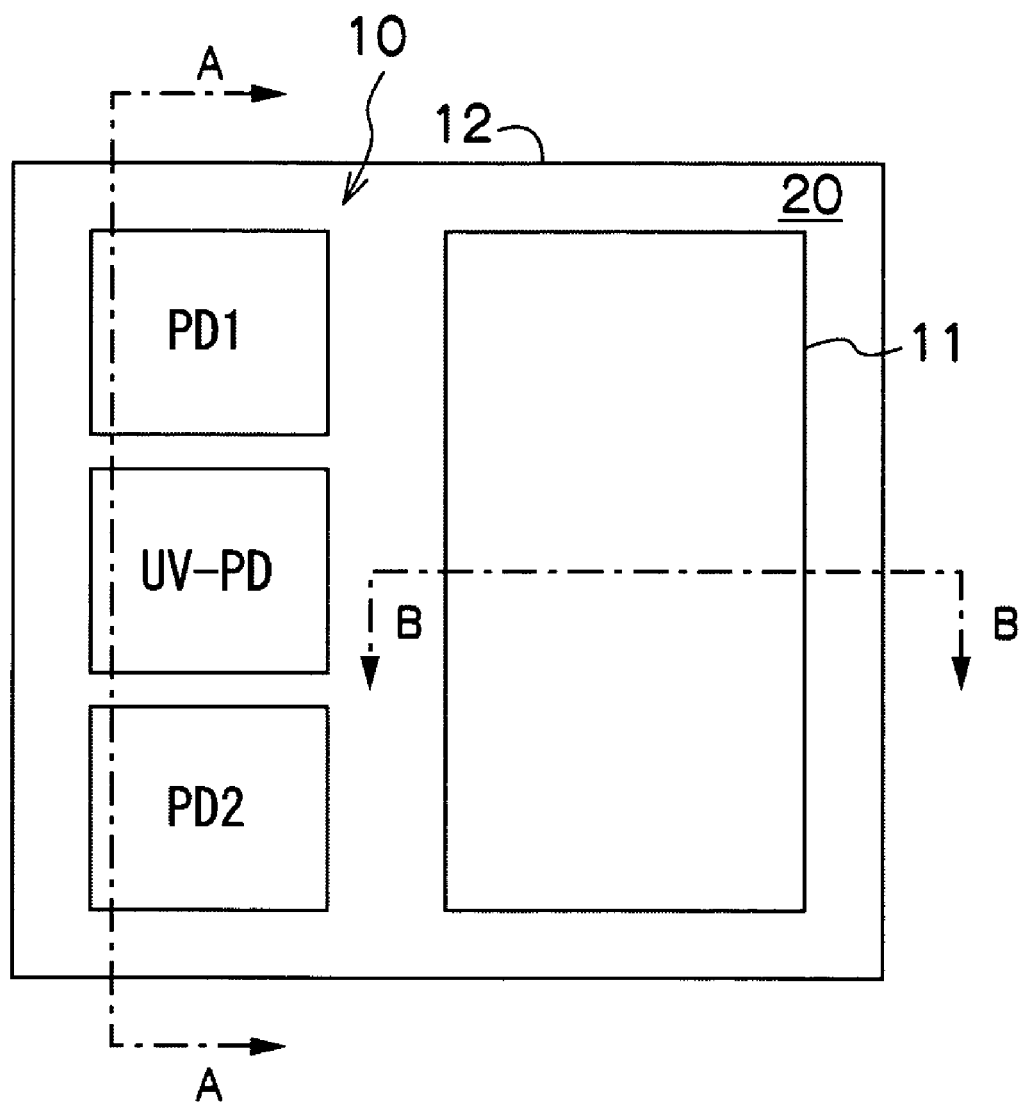
FIG. 1 is a schematic plan view of a light sensor according to a first exemplary embodiment of the present invention.

FIG. 1 is a schematic plan view of a light sensor according to a first exemplary embodiment of the present invention. In the plan view shown in FIG. 1, regions for forming plural photodiodes and a control circuit are shown. As shown in FIG. 1, the light sensor according to the present exemplary embodiment is a so-called "photo IC" of a single chip, with plural photodiodes arrayed in a photodiode array 10, and a control circuit 11 that controls each of the photodiodes, formed on an SOI (Silicon On Insulator) substrate 12, described later.

The photodiode array 10 is equipped with 3 types of photodiode: a standard silicon photodiode PD1 with no spectral sensitivity correction; a photodiode PD2 with sensitivity to infrared light; and a photodiode UV-PD with sensitivity to ultraviolet light. This example is equipped with one of each type of photodiode, a total of 3 individual photodiodes.

Figure 20A:
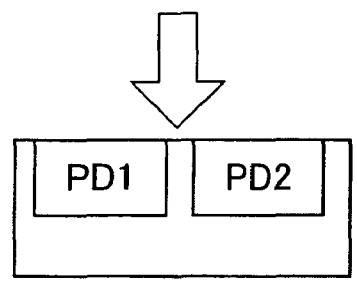
FIG. 20A to FIG. 20C are diagrams for explaining an existing spectral sensitivity correction method.
Figure 20B:
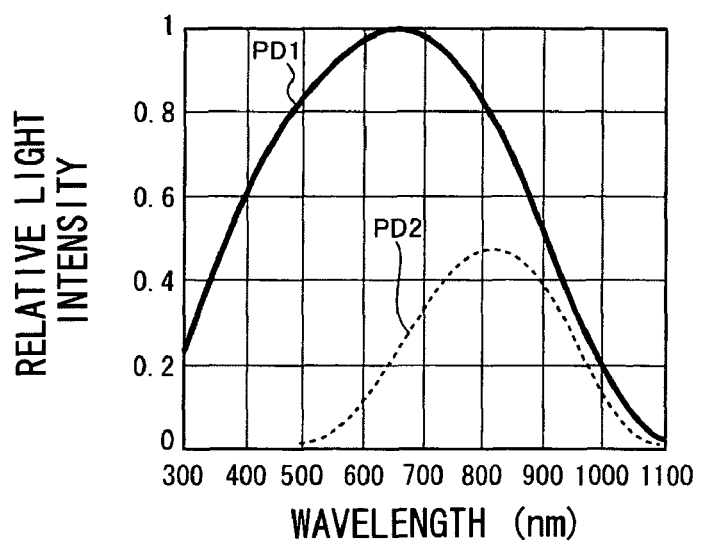
Figure 20C:
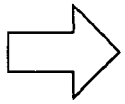
Figure 20C:
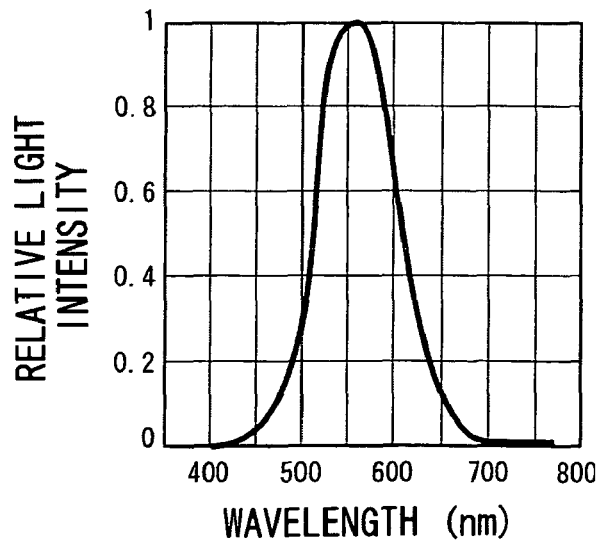
Figure 21A:
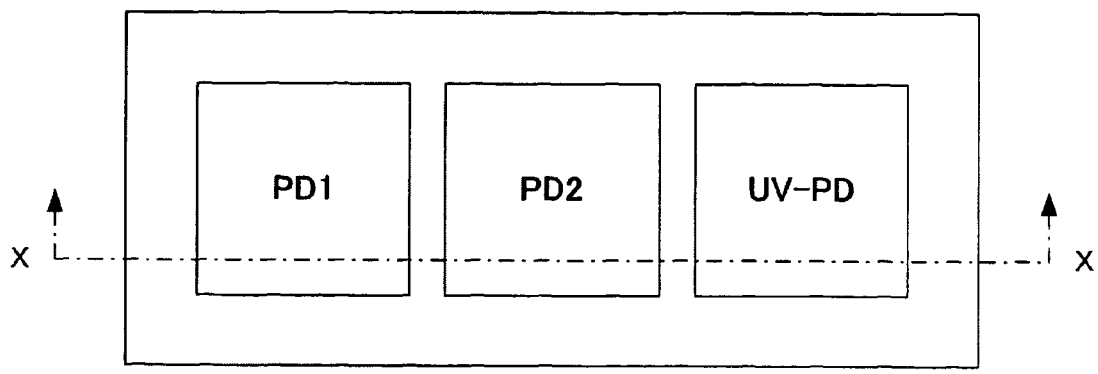
FIG. 21A is a plan view showing a configuration of a multi-function light sensor before improvement.
Figure 21B:
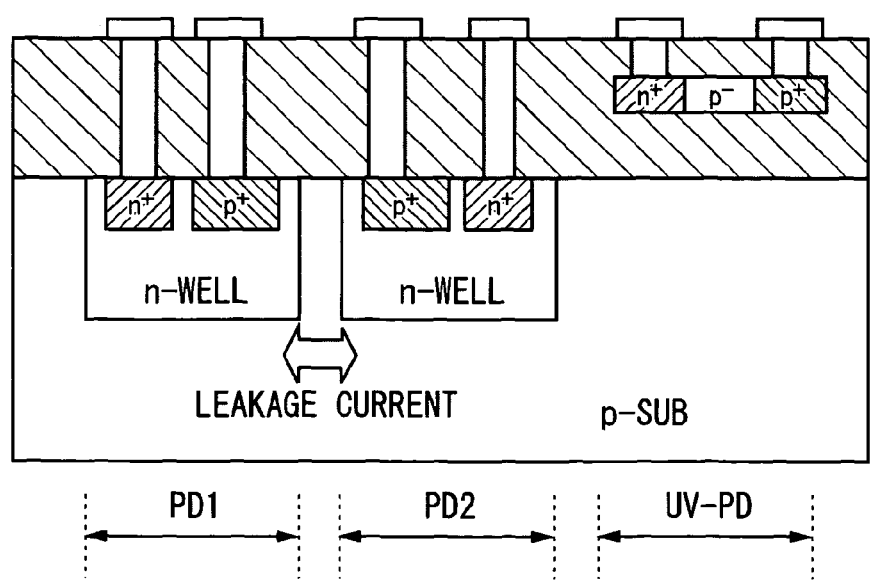
FIG. 21B is a cross-section taken on line X-X of the light sensor.

The standard silicon photodiode PD1 with no spectral sensitivity correction, as shown in FIG. 20B, generally has a peak at wavelengths of 600 nm to 700 nm, and sensitivity spreading out in a wide range to wavelengths from 300 nm to 1100 nm. The photodiode UV-PD with sensitivity to ultraviolet light is a photodiode having sensitivity to light in the ultraviolet region of wavelengths of 400 nm or less.

The photodiode PD2 with sensitivity to infrared light is a photodiode having sensitivity to light in the infrared region mainly of wavelengths from 800 nm to 1100 nm. The visible region is generally defined as being in the range of wavelengths from 400 nm to 800 nm, however the main range of visible light humans are capable of detecting is the range from 440 nm to 700 nm. Consequently, a photodiode having a peak at a wavelength in the vicinity of 800 nm and sensitivity in the range from 500 nm to 1100 nm (namely having sensitivity to the visible range) can, for example, be used as the photodiode PD2, as shown in FIG. 20B.

The control circuit 11 is an integrated circuit in which various circuits including an amplifier circuit explained below are integrated. The control circuit 11 controls each of the photodiodes, and also amplifies the output signals (current flow) of each of the photodiodes, and performs various types of computational processing, such as spectral sensitivity correction etc.

The control circuit 11 is formed in a rectangular shape. The photodiodes PD1, PD2 and UV-PD are disposed adjacent to the control circuit 11, arrayed along one of the long sides of the control circuit 11. Each of the photodiodes PD1, PD2 and UV-PD is formed in a rectangular region. The photodiodes PD1 and PD2 are placed at two respective sides of the photodiode UV-PD, with the photodiode UV-PD interposed therebetween. Each of the photodiodes PD1 and PD2 is disposed adjacent to the photodiode UV-PD such that a given side of the photodiode UV-PD mutually faces one of the sides of the PD1, and the opposing side to the given side of the photodiode UV-PD mutually faces one side of the photodiode PD2. Namely, the three types of photodiode are arrayed adjacent to each other in the sequence PD1, UV-PD, PD2 in a single dimension alongside the control circuit 11.

Figure 2:
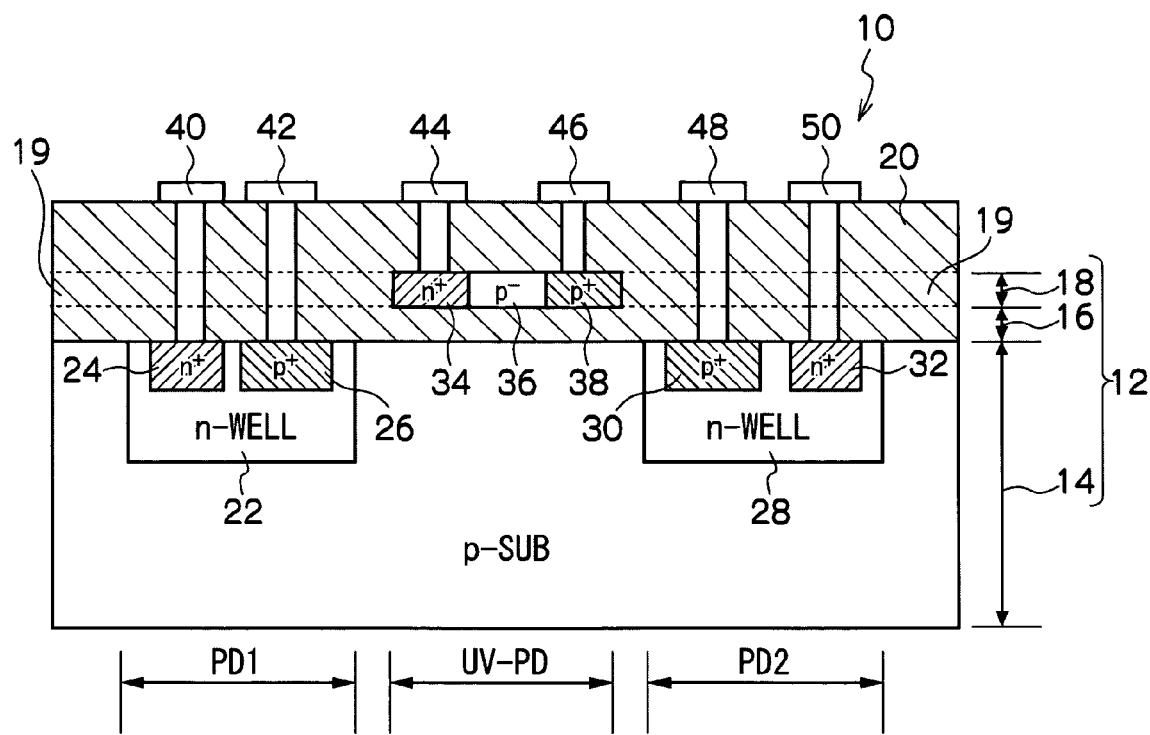
FIG. 2 is a cross-section taken on line A-A of a photodiode array portion of the light sensor of FIG. 1.
Figure 3:
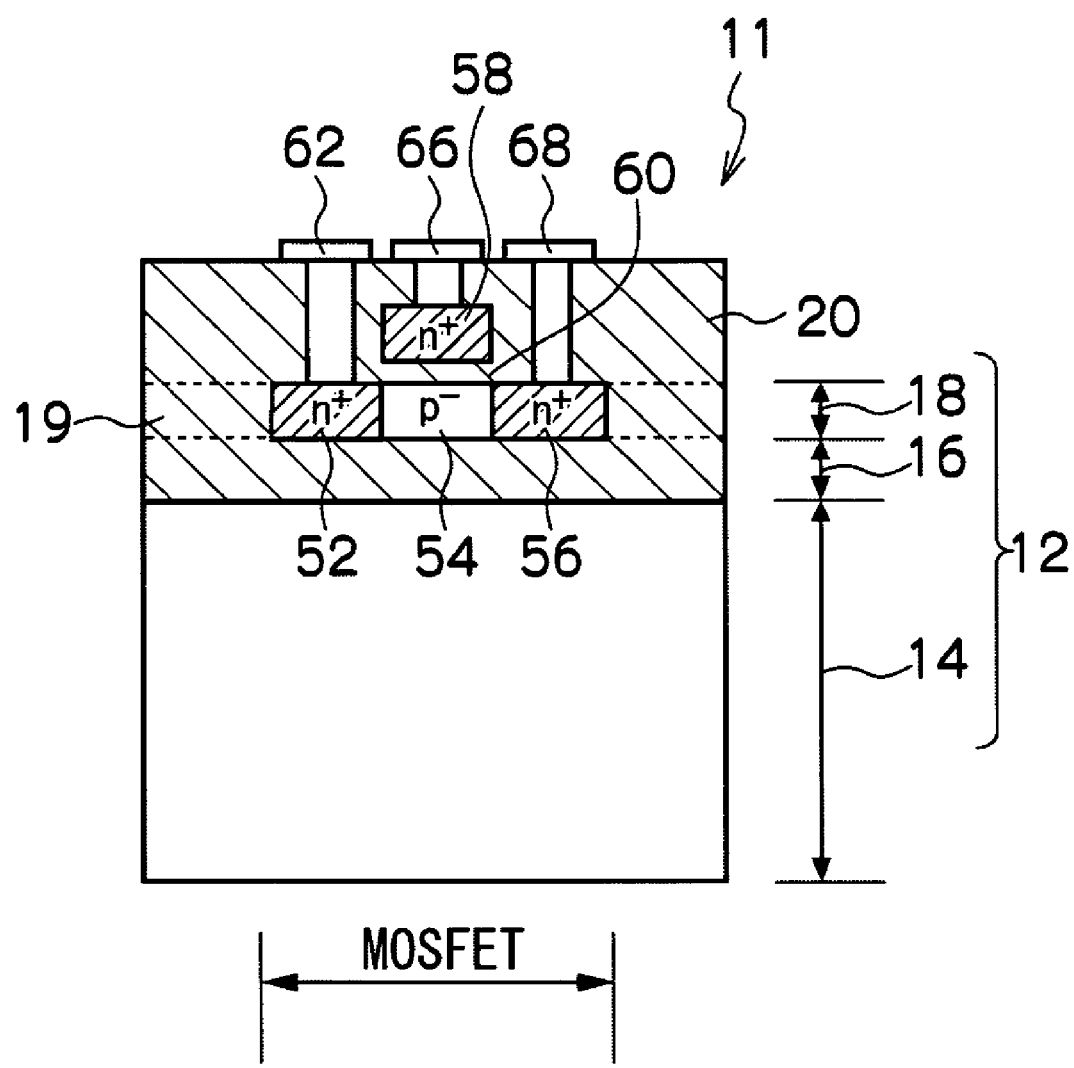
FIG. 3 is a cross-section taken on line B-B of a control circuit portion of the light sensor of FIG. 1.

FIG. 2 is a cross-section of the photodiode array portion of the light sensor of FIG. 1, taken on line A-A. FIG. 3 is a cross-section of the control circuit portion of the light sensor of FIG. 1, taken on line B-B. FIG. 3 is not a true cross-section, and is a diagram schematically representing the control circuit with a single MOSFET (Metal-Oxide-Semiconductor Field-Effect Transistor) configuring the control circuit 11.

As shown in FIG. 2 and FIG. 3, the light sensor is equipped with an SOI substrate 12, made up from a silicon substrate 14, with a silicon oxide ($SiO_2$) insulating film 16 and a silicon semiconductor layer 18, of single crystal silicon, formed thereon. The silicon semiconductor layer 18 is formed in a thin film of several nm to several tens of nm thick. In the present exemplary embodiment, a p-type silicon substrate is used for the silicon substrate 14. The silicon substrate 14 will sometimes be referred to below as a p-type silicon substrate 14 where appropriate. The silicon oxide insulating film 16 will also sometimes be abbreviated to insulating film 16 below as appropriate.

In brief overall outline explanation, the photodiodes PD1 and PD2 are formed on the silicon substrate 14, and the photodiode UV-PD and main portions of the MOSFET (source, drain, and channel regions) are formed on the silicon semiconductor layer 18 that is on the insulating film 16. Namely, the photodiode UV-PD and the control circuit 11 are respectively insulated from the photodiodes PD1 and PD2 by the silicon oxide insulating film 16 of the SOI substrate 12. Detailed explanation will now be given of the layered structure referring to the cross-sections.

Explanation will first be given with respect to the photodiode array 10, with reference to FIG. 2. The photodiodes PD1 and PD2 are formed in the vicinity of the surface of the silicon substrate 14. The photodiode UV-PD is formed in the silicon semiconductor layer 18 that is on the insulating film 16. The silicon semiconductor layer 18 is oxidized to leave the photodiode UV-PD, and a LOCOS oxide film 19 is formed from silicon oxide at the periphery of the photodiode UV-PD etc. The surface of the photodiode array 10 is flattened with an insulating planarization film 20. The side of the planarization film 20 of the photodiode array 10 is the light receiving face.

The photodiode PD1 is provided with an n-well 22 that is a region of the p-type silicon substrate 14 in which an n-type impurity has been diffused at a low concentration. An n$^+$-type diffusion region 24 with a n-type impurity diffused at high concentration, and a p$^+$-type diffusion region 26 with a p-type impurity diffused at high concentration, are formed in the n-well 22. Namely, in the photodiode PD1 the n$^+$-type diffusion region 24 and the p$^+$-type diffusion region 26 are disposed in the silicon substrate 14 along the direction of a main face of the substrate (the surface direction). It should be noted that the surface direction of the silicon substrate 14 and the surface direction of the SOI substrate 12 are the same as each other. The n-well 22 and the n$^+$-type diffusion region 24 are n-type regions. pn junctions are formed between these n-type regions and the p$^+$-type diffusion region 26. A depletion layer is formed in the region of low impurity concentration between the n$^+$-type diffusion region 24 and the p$^+$-type diffusion region 26. Electromotive force is generated by light absorbed in this depletion layer.

The n$^+$-type diffusion region 24 is electrically connected to one end of a cathode 40. The cathode 40 passes through the insulating film 16, the LOCOS oxide film 19 and the planarization film 20, and the other end of the cathode 40 is exposed from the planarization film 20. The p$^+$-type diffusion region 26 is electrically connected to one end of an anode 42. The anode 42 passes through the insulating film 16, the LOCOS oxide film 19 and the planarization film 20, and the other end of the anode 42 is exposed from the planarization film 20.

The photodiode PD2 is provided with an n-well 28 that is a region of the p-type silicon substrate 14 in which an n-type impurity has been diffused at a low concentration. A p$^+$-type diffusion region 30 with a p-type impurity diffused at high concentration and an n$^+$-type diffusion region 32 with an n-type impurity diffused at high concentration, are formed in the n-well 28. Namely, in the photodiode PD2 the p$^+$-type diffusion region 30 and the n$^+$-type diffusion region 32 are disposed in the silicon substrate 14 along the direction of a main face of the substrate. The n-well 28 and the n$^+$-type diffusion region 32 are n-type regions. There are formed pn junctions between these n-type regions and the p$^+$-type diffusion region 30. A depletion layer is formed in the region of low impurity concentration between the p$^+$-type diffusion region 30 and the n$^+$-type diffusion region 32. Electromotive force is generated by light (infrared light) absorbed in this depletion layer.

The p$^+$-type diffusion region 30 is electrically connected to one end of an anode 48. The anode 48 passes through the insulating film 16, the LOCOS oxide film 19 and the planarization film 20, and the other end of the anode 48 is exposed from the planarization film 20. The n$^+$-type diffusion region 32 is electrically connected to one end of a cathode 50. The cathode 50 passes through the insulating film 16, the LOCOS oxide film 19 and the planarization film 20, and the other end of the cathode 50 is exposed from the planarization film 20.

The photodiode UV-PD is formed on the silicon semiconductor layer 18 present above the silicon oxide insulating film 16, as described above. Namely, the photodiode UV-PD is formed above the silicon substrate 14, with the silicon oxide insulating film 16 interposed therebetween.

The photodiode UV-PD is provided with an n$^+$-type diffusion region 34 with a n-type impurity diffused at high concentration, and a p$^-$-type diffusion region 36 with a p-type impurity diffused at low concentration, and a p$^+$-type diffusion region 38 with a p-type impurity diffused at high concentration. The p$^-$-type diffusion region 36 is formed adjacent to the n$^+$-type diffusion region 34, and the p$^+$-type diffusion region 38 is formed adjacent to the p$^-$-type diffusion region 36. Namely, in the photodiode UV-PD, the n$^+$-type diffusion region 34, the p$^-$-type diffusion region 36, and the p$^+$-type diffusion region 38 are disposed in the silicon substrate 14 in this sequence along the direction of the main face of the substrate (which is also the surface direction of the silicon semiconductor layer 18).

The p$^-$-type diffusion region 36 and the p$^+$-type diffusion region 38 are p-type regions. pn junctions are formed between these p-type regions and the n$^+$-type diffusion region 34. A depletion layer is formed in the p$^-$-type diffusion region 36 of low impurity concentration between the n$^+$-type diffusion region 34 and the p$^+$-type diffusion region 38. Electromotive force is generated by light (ultraviolet light) absorbed in this depletion layer.

The n$^+$-type diffusion region 34 is electrically connected to one end of a cathode 44. The cathode 44 passes through the planarization film 20, and the other end of the cathode 44 is exposed from the planarization film 20. The p$^+$-type diffusion region 38 is electrically connected to one end of an anode 46. The anode 46 passes through the planarization film 20, and the other end of the anode 46 is exposed from the planarization film 20.

Explanation will now be given of the structure of a MOSFET configuring the control circuit 11, with reference to FIG. 3. FIG. 3 is a schematic diagram showing an n-channel MOSFET (NMOS) as an example of a MOSFET. In addition to the photodiode UV-PD as described above, a portion of the control circuit 11 including the MOSFET is also formed in the silicon semiconductor layer 18. The silicon semiconductor layer 18 is oxidized leaving the MOSFET portion remaining un-oxidized, and the LOCOS oxide film 19 is formed from silicon oxide around the periphery of the MOSFET portion.

The MOSFET is provided in the silicon semiconductor layer 18 with a source 52 formed from an n$^+$-type diffusion region with an n-type impurity diffused at high concentration, and channel region 54 formed from a p$^-$-type diffusion region with a p-type impurity diffused at low concentration, and a drain 56 formed from an n$^+$-type diffusion region with a n-type impurity diffused at high concentration. The source 52 is formed adjacent to the channel region 54, and the drain 56 is formed adjacent to the channel region 54. Namely, in the MOSFET, the source 52, the channel region 54, and the drain 56 are disposed in the silicon substrate 14 in this sequence along the direction of the main face of the substrate (which is also the surface direction of the silicon semiconductor layer 18).

The MOSFET is also provided with a gate 58 formed from an n$^+$-type diffusion region with an n-type impurity diffused at high concentration above the channel region 54 formed in the silicon semiconductor layer 18. A gate insulating film 60 is provided between the gate 58 and the channel region 54, and around the periphery of the 58, such as at the side faces of the gate 58 etc., the gate insulating film 60 being formed of silicon oxide in the same manner as the insulating film 16. The gate 58 is insulated by the gate insulating film 60 from the source 52, channel region 54, and drain 56 formed in the silicon semiconductor layer 18. The surface of the control circuit 11 is flattened with the planarization film 20 having insulating properties.

The source 52 is electrically connected to one end of a source electrode 62. The source electrode 62 passes through the gate insulating film 60 and the planarization film 20, and the other end of the source electrode 62 is exposed from the planarization film 20. The drain 56 is electrically connected to one end of a drain electrode 68. The drain electrode 68 passes through the gate insulating film 60 and the planarization film 20, and the other end of the drain electrode 68 is exposed from the planarization film 20. The gate 58 is electrically connected to one end of a gate electrode 66. The gate electrode 66 passes through the gate insulating film 60 and the planarization film 20, and the other end of the gate electrode 66 is exposed from the planarization film 20.

When a positive voltage is applied from the gate electrode 66 to the gate 58 in the MOSFET (NMOS) shown in FIG. 3, the switch adopts the ON state, and current flows from the source 52 to the drain 56.

Figure 4:
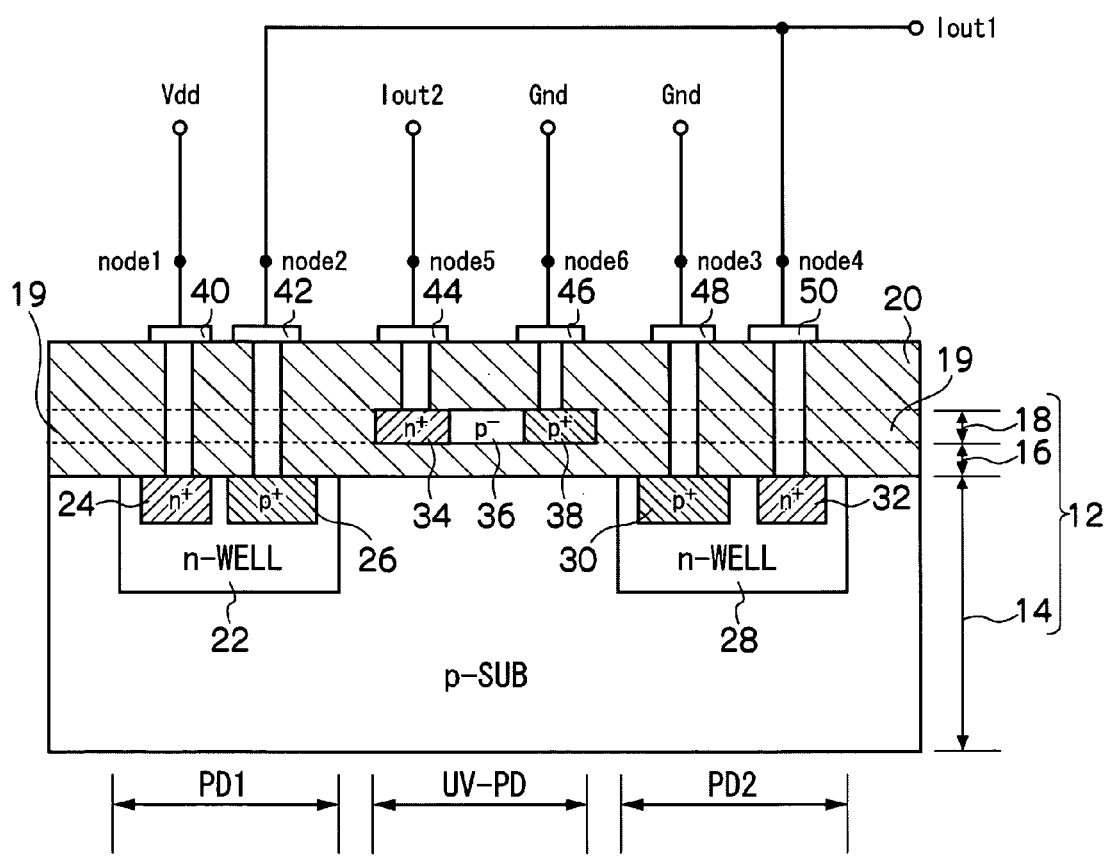
FIG. 4 is a diagram for explaining the electrically connections of each electrode.

Explanation will now be given of the electrical connection relationships of each of the electrodes, with reference to FIG. 4. The cathode 40 is connected to a terminal node 1. The anode 42 is connected to a terminal node 2. The anode 48 is connected to a terminal node 3. The cathode 50 is connected to a terminal node 4. The other end of the cathode 44 is connected to a terminal node 5. The other end of the anode 46 is connected to a terminal node 6. Explanation of the connection relationships of the MOSFET is abbreviated to the above.

The terminal node 1 connected to the cathode 40 of the photodiode PD1 is connected to a power source input terminal $V_{dd}$. The terminal node 3 connected to the anode 48 of the photodiode PD2 is connected to a ground terminal Gnd. An intermediate point along the connection between the terminal node 2 connected to the anode 42 of the photodiode PD1 and the terminal node 4 connected to the cathode 50 of the photodiode PD2 is connected to a current output terminal I out 1.

The terminal node 6 connected to the anode 46 of the photodiode UV-PD is also connected to the ground terminal Gnd. The terminal node 5 connected to the cathode 44 of the photodiode UV-PD is connected to a current output terminal I out 2.

Light is incident from the planarization film 20 side of the photodiode array 10. The incident visible light and infrared light is transmitted through the planarization film 20, LOCOS oxide film 19, insulating film 16, etc., and is received by the photodiodes PD1, PD2, respectively, electromotive force is generated and a photoelectric current flows. Incident ultraviolet light is transmitted through the planarization film 20 and is received by the photodiode UV-PD, electromotive force is generated and a photoelectric current flows. These photoelectric currents can be externally read from the electrodes by application of a bias voltage.

Equivalent Circuit and Output Current

Figure 5:
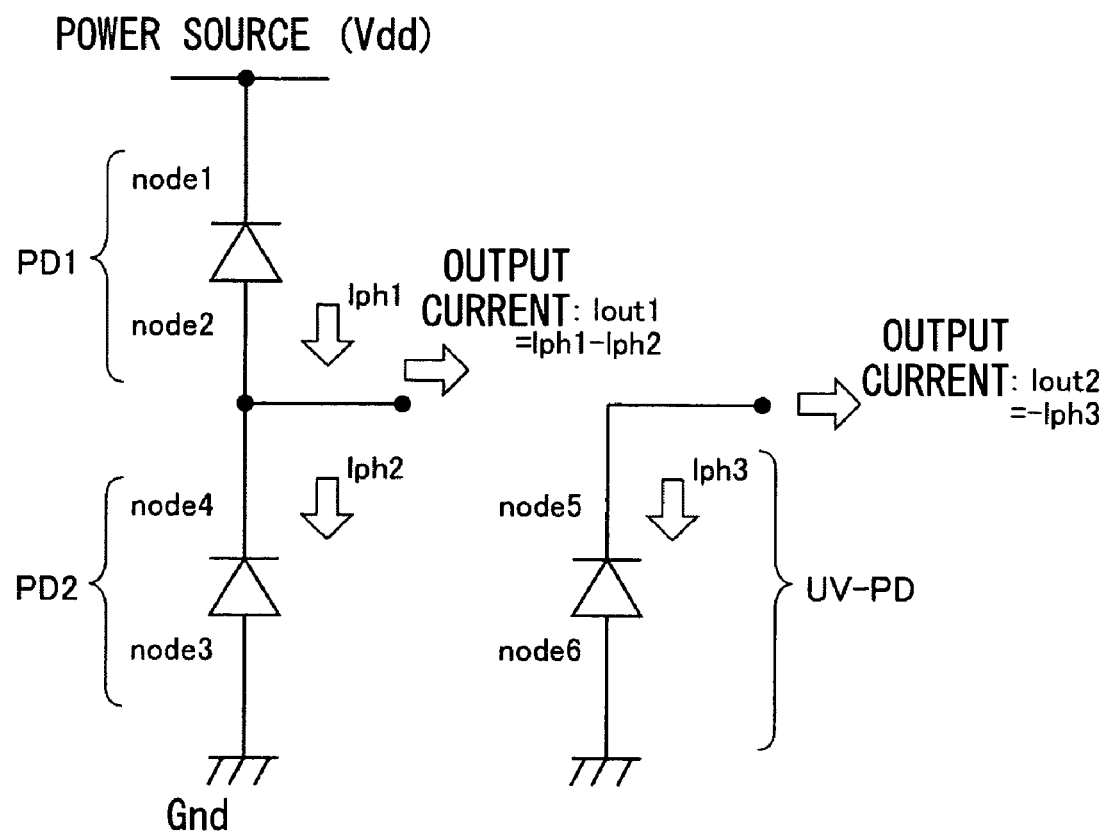
FIG. 5 is an electrical circuit diagram of a light sensor according to the first exemplary embodiment.

FIG. 5 is an electrical circuit diagram of a light sensor according to the present exemplary embodiment. As shown in FIG. 5, in the photodiode PD1, a photoelectric current I ph1 flows from the terminal node 1 connected to the cathode 40, toward the terminal node 2 connected to the anode 42. In the photodiode PD2, a photoelectric current I ph2 flows from the terminal node 4 connected to the cathode 50, to the terminal node 3 connected to the anode 48. Consequently, a difference current (I ph1–I ph2) of the photoelectric current I ph1 and the photoelectric current I ph2 is output to the current output terminal I out 1 from the intermediate point in the connection between the terminal node 2 and the terminal node 4. The influence of infrared light can be removed by detecting this difference current.

In the photodiode UV-PD, a photoelectric current I ph3 flows from the terminal node 5 connected to the cathode 44 toward the terminal node 6 connected to the anode 46. Consequently a photoelectric current (–I ph3) is output from the terminal node 5 to the current output terminal I out 2. By consideration of the photoelectric current (–Iph3) output from the current output terminal I out 2, and by detecting the difference current (Iph1–Iph2–Iph3), the influence of ultraviolet light can also be removed. A spectral sensitivity can thereby be obtained that approximates to that of human spectral sensitivity.

It should be noted that spectral sensitivity correction processing by detecting the difference current as described above is performed in the control circuit 11 of the light sensor. The output terminals of each of the photodiodes are connected to the input terminals of the control circuit 11. The values of the photoelectric currents detected by each of the photodiodes are input to the control circuit 11. In a spectral sensitivity correction section (not shown in the drawings), the "difference current" is computed from the values of the input photoelectric currents, the influence due to ultraviolet light and infrared light is removed, and spectral sensitivity correction processing is performed.

Element Separation Distance and Leak Current

In cases where the photodiodes PD1 and PD2 are disposed so as to be adjacent to each other, the n-wells formed by injection of impurity ions are adjacent to each other. The impurity ions diffuse in the horizontal direction when the impurity ions are being implanted, and there is no sharp gradient in impurity ions concentration. Consequently, even when the photodiodes PD1 and PD2 are formed with a separation distance designed such that no leak current occurs, incomplete isolation of the elements can occur.

Figure 6:
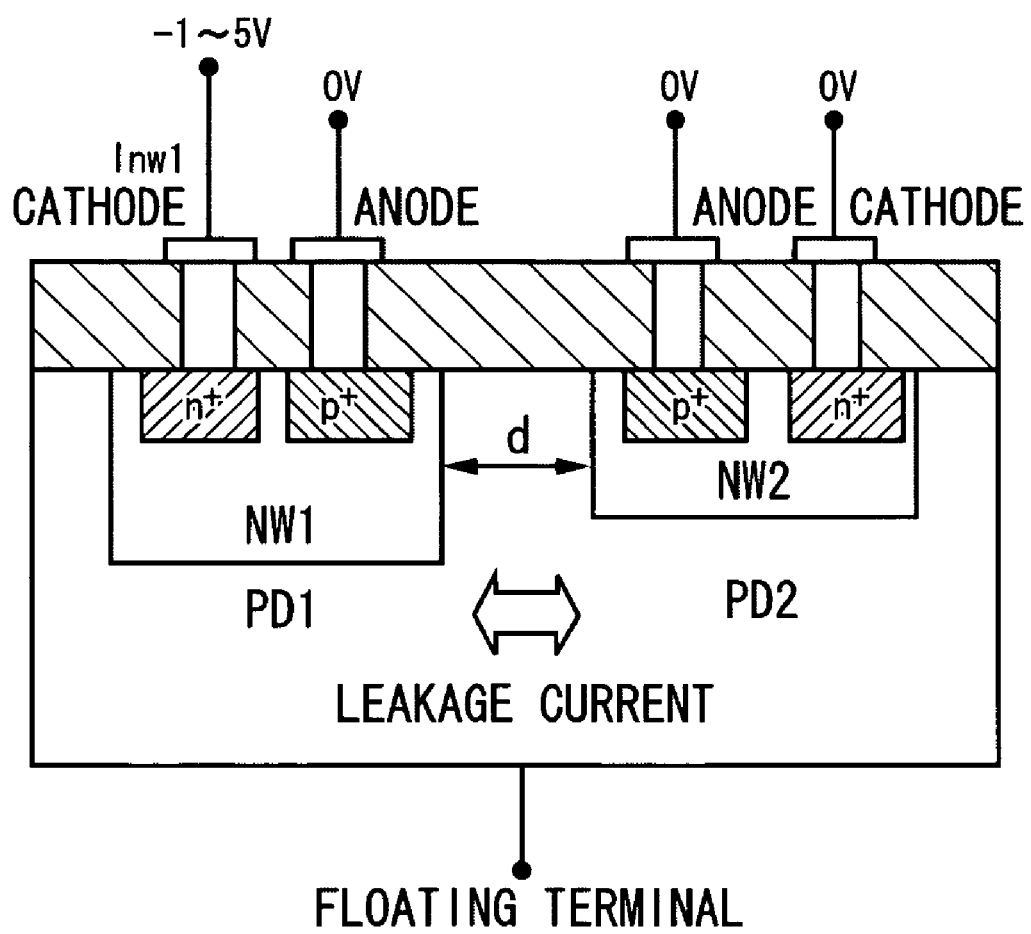
FIG. 6 is a schematic cross-section showing a configuration of a photodiode array used in tests.

With respect to the photodiode array in which the photodiode PD1 and the photodiode PD2 are formed so as to be adjacent to each other on the silicon substrate, as shown in FIG. 6, the correlation between the separation distance and the leak current flowing between the elements has been derived experimentally. The experimental results are shown in FIG. 7 to FIG. 10. The term "separation distance" here refers to separation distance d between the mutually facing side faces of the n-well for the photodiode PD1 (NW 1) and the n-well of the photodiode PD2 (NW 2).

As shown in FIG. 6, voltages (Vns1) of –1 V to 5 V were applied to the cathode terminal of the photodiode PD1. The electrical potential of the anode terminal of the photodiode PD1 and the electrical potential of the anode terminal and the cathode terminal of the photodiode PD2 were made 0V. The terminal of the silicon substrate was left floating. The absolute value of the current Inw1 input from the cathode terminal of the photodiode PD1 in this state represents the magnitude of the leak current between the "NW1" and the NW2". Comparison is made below of the relationship between separation distance and leak current at the values of the voltage (Vns1) 0V to 5V where Inw1 is positive.

Figure 7:
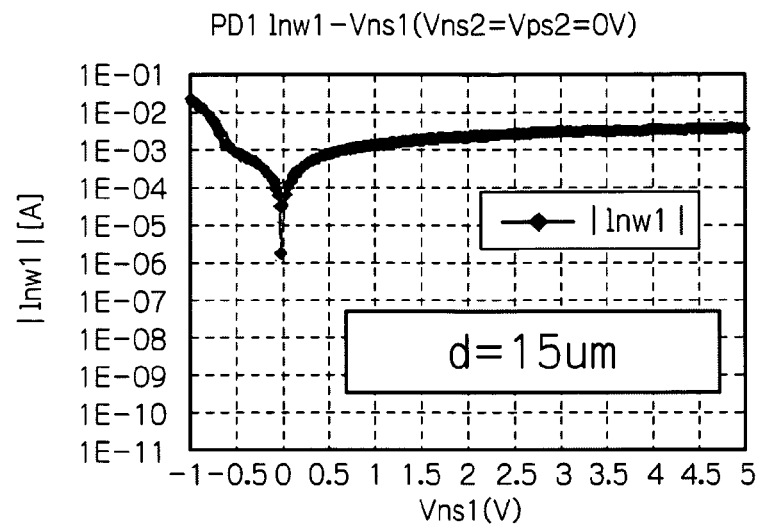
FIG. 7 is a graph showing leak current amount against applied voltage with a separation distance of 15 μm.
Figure 8:
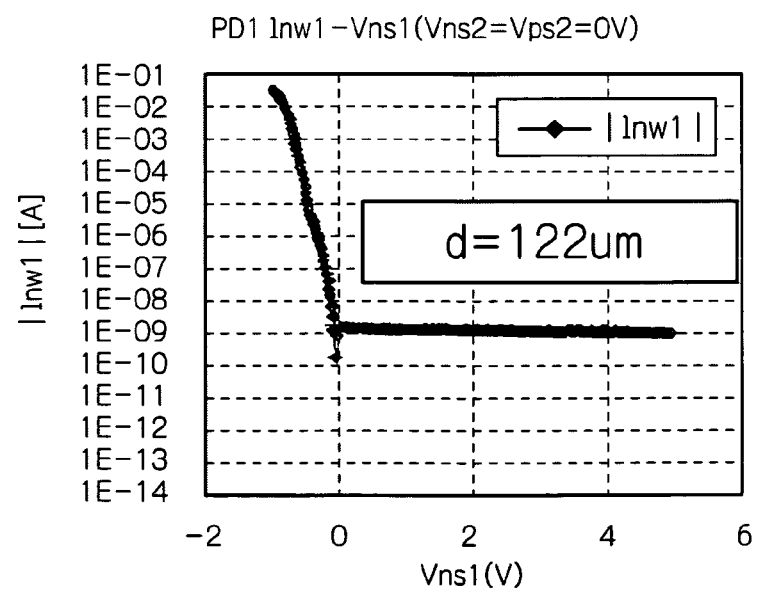
FIG. 8 is a graph showing leak current amount against applied voltage with a separation distance of 122 μm.

As shown in FIG. 7, when the separation distance d is "15 µm", the magnitude of the leak current is $1\times10^{-6}$ to $1\times10^{-2}$ at between 0V and 5V. In contrast, as shown in FIG. 8, when the separation distance d is "122 µm", the magnitude of the leak current is $1\times10^{-10}$ to $1\times10^{-9}$ at between 0V and 5V. The maximum value of the leak current is reduced by a factor of six decimal places in comparison to when the separation distance d is "15 µm". It should be noted that the junction surface area of the PD1 is 0.02 mm$^2$ and the junction surface area of the PD2 is 0.01 mm$^2$.

Figure 9:
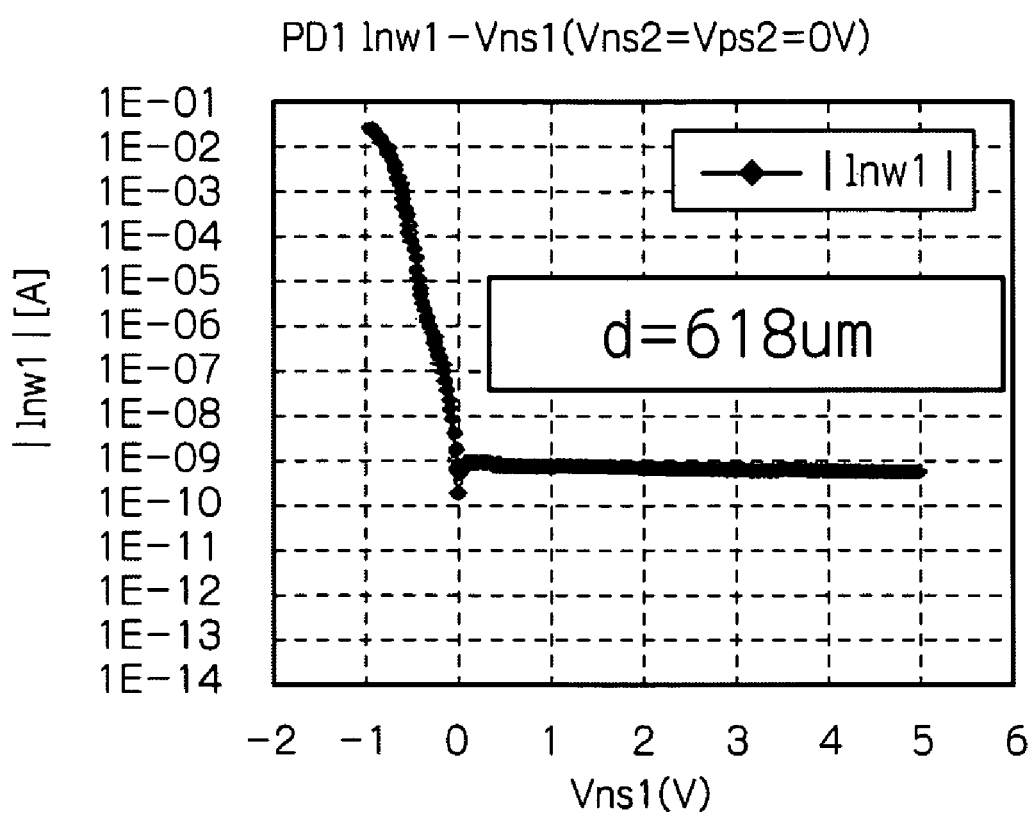
FIG. 9 is a graph showing leak current amount against applied voltage with a separation distance of 618 μm.

In addition, as shown in FIG. 9, when the separation distance d is "618 µm" the magnitude of the leak current is $1\times10^{-10}$ to $1\times10^{-9}$ at between 0V and 5V. In same manner, the maximum value of the leak current is reduced by a factor of six decimal places in comparison to when the separation distance d is "15 µm". It should be noted that the junction surface area of the PD1 here is 0.04 mm$^2$ and the junction surface area of the PD2 is 0.01 mm$^2$.

Figure 10:
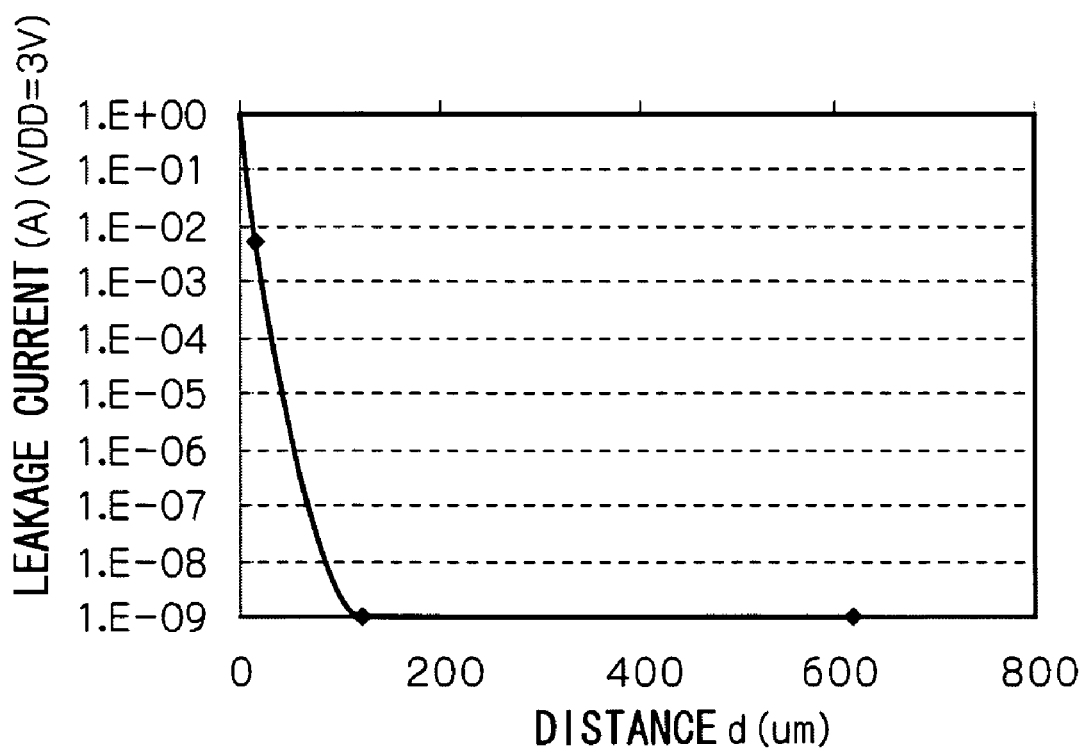
FIG. 10 is a graph showing leak current amount against separation distance with an applied voltage of 3V.

FIG. 10 is a graph showing the relationship between the separation distance d and the magnitude of the leak current, when Vns1=3V. There are 3 points in the data, there is a dramatic reduction in the leak current between a separation distance d of 15 µm and separation distance d of 122 µm, with a reduction in leak current achievable by making the separation distance 120 µm or greater of six decimal places or greater than when the separation distance d is "15 µm". The maximum leak current here is then about $1\times10^{-9}$, and conditions can be made such that no leak current occurs in practice.

As explained above, in the first exemplary embodiment, the photodiodes PD1 and PD2 are disposed on either side of the photodiode UV-PD, with the photodiode UV-PD interposed therebetween. Consequently, since the photodiodes PD1 and PD2 are disposed with sufficient separation distance therebetween, leak current does not occur between the photodiodes PD1 and PD2. By preventing leak current occurring a multi-function light sensor equipped with both an ultraviolet light sensor and a visible light sensor is capable of being practically provided at low cost.

Even when a surface area of, for example, about 300 µm×300 µm is allowed for the surface area of a region formed with a single photodiode, a sufficient separation distance of 300 µm can be achieved between the photodiodes PD1 and PD2 simply by interposing the photodiode UV-PD therebetween. According to the above experimental data, the leak current can be reduced to six decimal places or less by having a separation distance of 120 µm or above. Namely, by having a separation distance of 120 µm or above there is no leak current occurring at a practical level.

In addition, the photodiode UV-PD is formed in the silicon semiconductor layer 18 above the silicon oxide insulating film 16. Namely, the photodiode UV-PD is insulated by the silicon oxide insulating film 16 and the LOCOS oxide film 19 from the photodiode PD1 and PD2. Consequently, leak current does not occur between the photodiode UV-PD and the photodiodes PD1 and PD2. The photodiode UV-PD is also insulated from the MOSFET by the LOCOS oxide film 19. Leak current therefore does not occur between the control circuit 11 and the photodiode UV-PD.

The main portions of the MOSFET (source, drain, and channel regions) are also formed in the silicon semiconductor layer 18 above the silicon oxide insulating film 16. The gate of the MOSFET is also formed in silicon semiconductor layer 18 with the gate insulating film 60 interposed. Namely, the MOSFET is insulated from the photodiodes PD1 and PD2 by the silicon oxide insulating film 16, the LOCOS oxide film 19 and the gate insulating film 60. A leak current therefore does not occur between the photodiodes PD1 and PD2 and the MOSFET (namely the control circuit 11).

Second Exemplary Embodiment

Light Sensor

Figure 11:
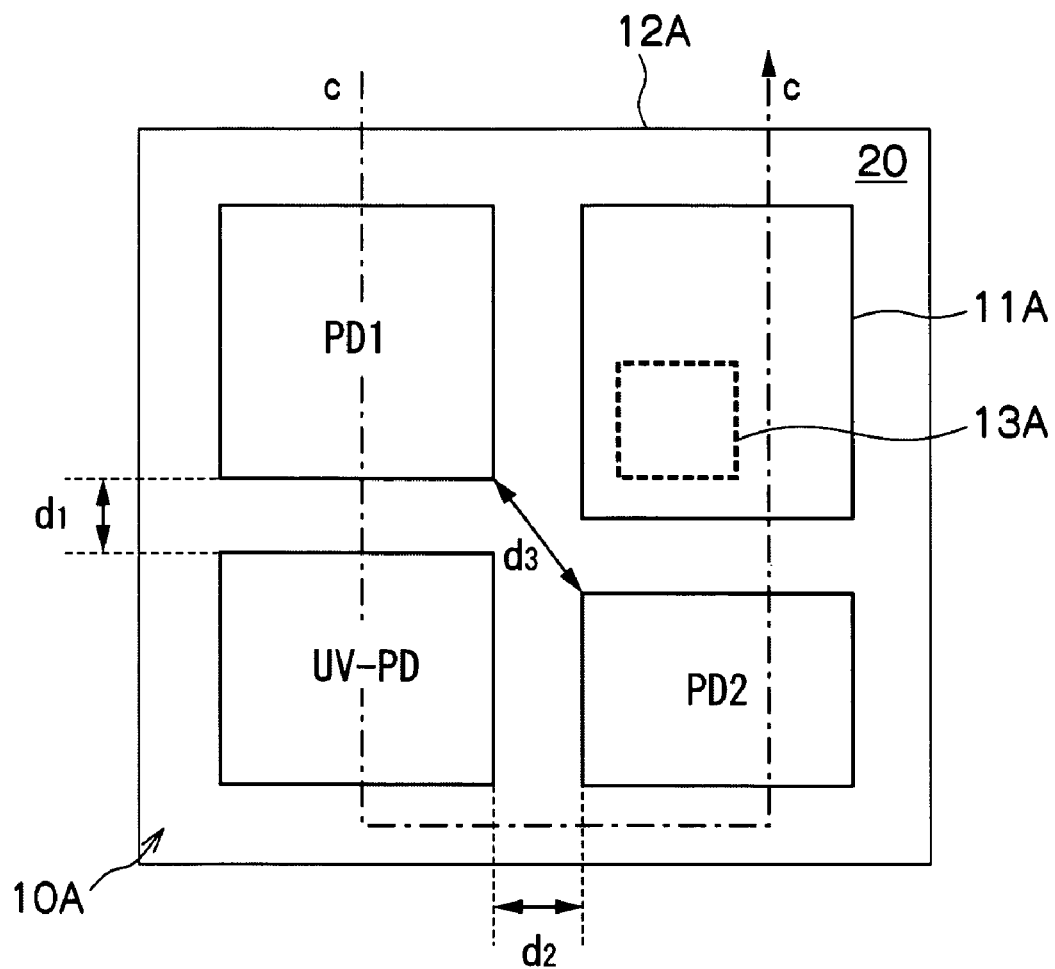
FIG. 11 is a schematic plan view of a light sensor according to a second exemplary embodiment of the present invention.

FIG. 11 is a schematic plan view of a light sensor according to a second exemplary embodiment of the present invention. The plan view shown in FIG. 11 diagrammatically illustrates forming regions for plural photodiodes and a control circuit. As shown in FIG. 11, the light sensor according to the present exemplary embodiment is a so-called "photo IC", a chip formed with a photodiode array 10A of plural photodiodes arrayed in an L-shape and a control circuit 11A, for controlling each of the photodiodes, formed on an SOI substrate 12A.

The photodiode array 10A, in the same manner as with that of the first exemplary embodiment, is equipped with 3 types of photodiodes: a standard silicon photodiode PD1 with no spectral sensitivity correction; a photodiode PD2 with sensitivity to infrared light; and a photodiode UV-PD with sensitivity to ultraviolet light. This example is equipped with one of each type of photodiode, a total of 3 individual photodiodes.

The control circuit 11A is an integrated circuit, in which various circuits, including an amplifier circuit 13A are integrated. In the same manner as in the first exemplary embodiment, the control circuit 11A controls each of the photodiodes, and also amplifies the output signals of each of the photodiodes, and performs various types of computational processing, such as spectral sensitivity correction etc. The amplifier circuit 13A is provided at a location within the control circuit 11A that is close to each of the photodiodes PD1 and PD2.

The control circuit 11A is formed in substantially a rectangular shape. Each of the photodiodes PD1 and PD2 and the photodiode UV-PD are also formed in regions of substantially a rectangular shape. The photodiodes PD1, PD2 and UV-PD are disposed so as to be adjacent to each other, and adjacent to the control circuit 11A. The photodiodes PD1, PD2 and UV-PD are arrayed in an L-shape around the control circuit 11A so as to form the light sensor as a whole with a rectangular shape not having a large vertical to horizontal ratio. In this manner, the control circuit is smaller, and by disposing the plural photodiodes in an L-shape the forming regions of the light sensor can be made more compact. The number of chips that can be taken from a wafer can thereby be increased.

The photodiodes PD1 and PD2 are disposed on two sides of the photodiode UV-PD, with the photodiode UV-PD interposed therebetween. More precisely, the photodiode UV-PD is disposed along a diagonal direction of the control circuit 11A (at the bottom left diagonal in the drawing). The photodiodes PD1 and PD2 are disposed adjacent to the two sides of the photodiode UV-PD which are disposed at, and adjacent to, the control circuit 11A side (the right side and the top side in the drawing), such that one side of the photodiode PD1 mutually faces a given side of the photodiode UV-PD, and one side of the photodiode PD2 mutually faces one side of the photodiode UV-PD that is adjacent to the given side. Namely, the three types of photodiode are arrayed adjacent to each other in an L-shape in the sequence PD1, UV-PD, PD2 around the control circuit 11A.

As shown in the experimental data of the first exemplary embodiment, when the photodiodes PD1 and PD2 are disposed adjacent to each other a leak current occurs between the elements. In order to prevent leak current occurring between the photodiodes PD1 and PD2, each of the photodiodes including the photodiode UV-PD are disposed separated by a specific separation. The determined positioning placement of the photodiode UV-PD insulated by the silicon oxide insulating film 16 is because placing the photodiodes PD1 and UV-PD adjacent, and the photodiodes PD2 and UV-PD adjacent, results in the photodiode PD1 and the photodiode PD2 being adjacent.

The separation distance d1 between the photodiode PD1 and the photodiode UV-PD is preferably 20 μm or greater, and the separation distance d2 between the photodiode PD2 and the photodiode UV-PD is preferably 20 μm or greater. The separation distance d3 between the photodiodes PD1 and PD2 is preferably a separation distance of 120 μm or greater, in accordance with the experimental results of the first exemplary embodiment.

Figure 12:
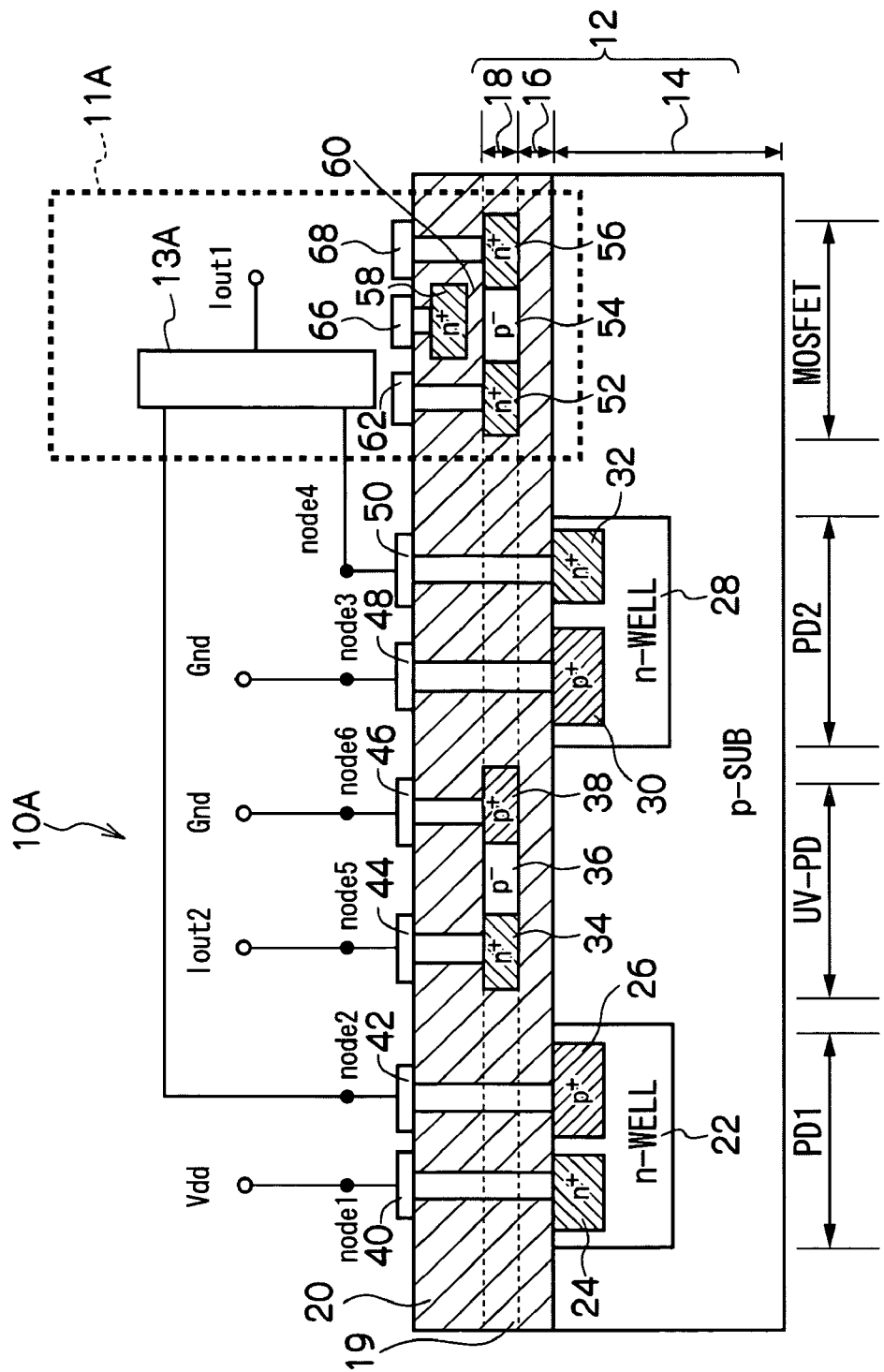
FIG. 12 is a control circuit taken on line C-C of the light sensor of FIG. 11.

FIG. 12 is a cross-section taken on line C-C of the light sensor of FIG. 11. The photodiode array portions and control circuit portions of the light sensor are shown in a single drawing. In FIG. 12 the electrical connection relationships of each of the electrodes are also merged and shown in the drawing. The control circuit portion is shown schematically as a single MOSFET configuring the control circuit 11A.

In brief overall outline explanation, in the same manner as in the first exemplary embodiment, the light sensor is equipped with an SOI substrate 12, made up from a silicon substrate 14, with a silicon oxide insulating film 16 and a silicon semiconductor layer 18, of a single crystal silicon, formed thereon. The photodiodes PD1 and PD2 are formed in the silicon substrate 14, and the photodiode UV-PD and the main portions of the MOSFET (source, drain and channel regions) are formed in the silicon semiconductor layer 18 above the insulating film 16. Namely, each of the photodiode UV-PD and the control circuit 11A is insulated from the photodiodes PD1 and PD2 by the silicon oxide insulating film 16 of the SOI substrate 12.

The structure of the photodiode array 10A and the structure of the MOSFET configuring the control circuit 11A is configured similar to that of the first exemplary embodiment, and therefore the same reference numerals will be allocated to the same structural portions and explanation thereof will be omitted.

Figure 13:
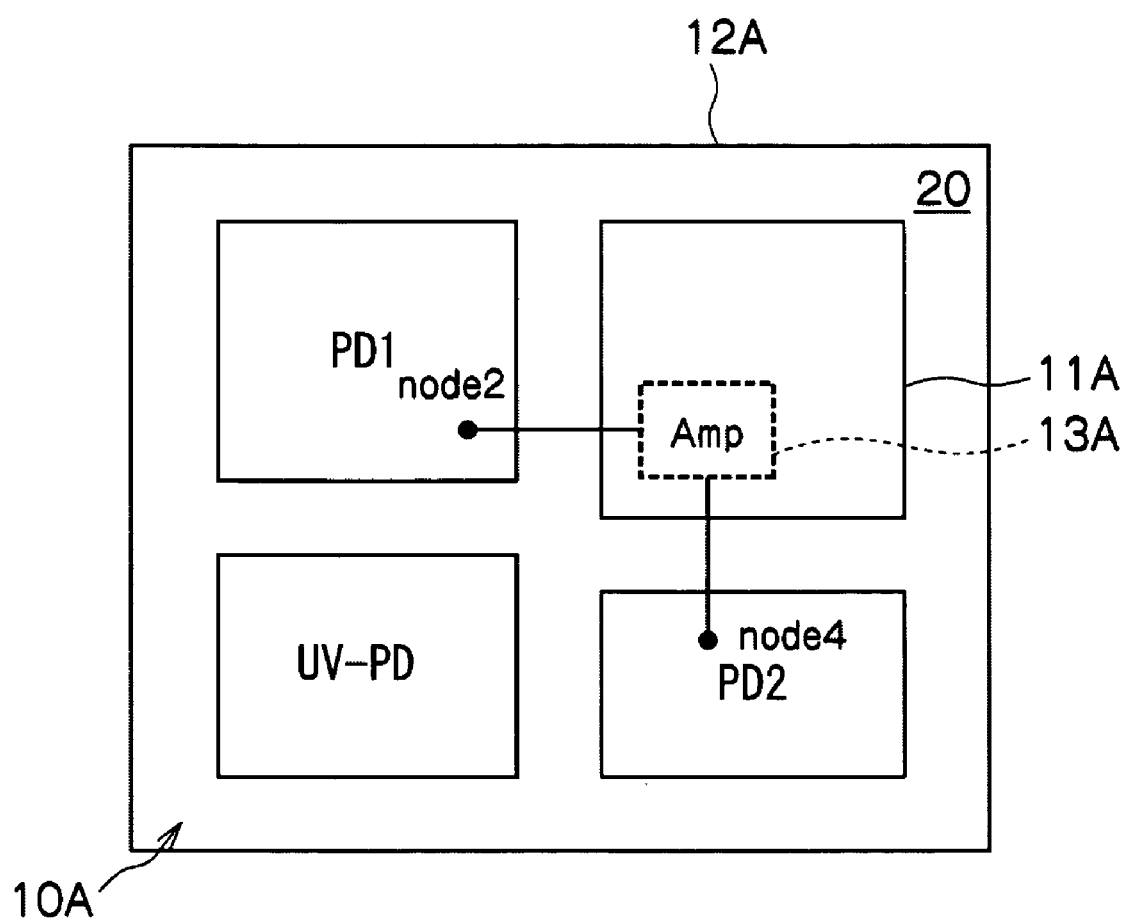
FIG. 13 is a plan view showing connection portions with a control circuit of the light sensor of FIG. 11.

As shown in FIG. 13, a terminal node 2 connected to an anode 42 of the photodiode PD1, and a terminal node 4 connected to a cathode 50 of the photodiode PD2, are connected to the input of the amplifier circuit 13A of the control circuit 11A. The output of the amplifier circuit 13A is connected to the current output terminal I out 1. In order to shorten the separation distance between the terminal node 2 and the terminal node 4, and to increase the detection precision, the amplifier circuit 13A is provided at a position near to each of the photodiodes PD1 and PD2, as described above.

A difference current (Iph1−Iph2) of the photoelectric current I ph1 and the photoelectric current I ph2, from the amplifier circuit 13A that is connected to the terminal node 2 and the terminal node 4, is output to the current output terminal I out 1. The amplifier circuit 13A shapes the output waveform from the input signal (current) and outputs a "difference current" to the current output terminal I out 1 in the control circuit 11A. The influence of infrared light can be removed by detecting the difference current.

In a similar manner to in the first exemplary embodiment, a photoelectric current (−I ph3) from the terminal node 5 is output to the current output terminal I out 2. By consideration of the photoelectric current (−I ph3) output from the current output terminal I out 2, and by detecting the difference current (Iph1−Iph2−Iph3), the influence of ultraviolet light can also be removed. A spectral sensitivity can thereby be obtained that approximates to that of human spectral sensitivity.

As explained above, in the second exemplary embodiment, the photodiodes PD1 and PD2 are disposed on two sides of the photodiode UV-PD in an L-shape, with the photodiode UV-PD interposed between the photodiodes PD1 and PD2. The three types of photodiodes, PD1, UV-PD, PD2 are disposed in this sequence an L-shape, and the photodiodes PD1 and PD2 are separated by a sufficient separation distance thereby in comparison to cases where the photodiodes PD1 and PD2 are disposed adjacent to each other. According to the above experimental data, leak current does not occur in practice if the separation distance is 120 μm or greater.

When the photodiodes PD1 and PD2 are disposed at two edges in an L-shape too, a straight line separation that achieves the above separation distance can readily be made. Consequently, leak current can be prevented from occurring between the photodiodes PD1 and PD2. By preventing occurrence of leak current, a multi-function light sensor equipped with an ultraviolet light sensor and a visible light sensor is capable of being practically provided at low cost.

The photodiodes PD1, PD2 and UV-PD are also arrayed in an L-shape around the control circuit 11A so as to form the light sensor as a whole with a rectangular shape not having a large vertical to horizontal ratio. In this manner, the control circuit is smaller, and by disposing the plural photodiodes in an L-shape the region formed with the light sensor can be made more compact. The number of chips that can be taken from a wafer can thereby be increased. With respect to this point a light sensor of even lower cost, in comparison to that of the first exemplary embodiment, is capable of being provided.

In addition, the photodiode UV-PD is formed in the silicon semiconductor layer 18 above the silicon oxide insulating film 16. Namely, the photodiode UV-PD is insulated from the photodiodes PD1 and PD2 by the silicon oxide insulating film 16 and the LOCOS oxide film 19. Leak current consequently does not occur between the photodiodes PD1 and PD2 and the photodiode UV-PD. In addition, the photodiode UV-PD is insulated from the MOSFET by the LOCOS oxide film 19. Leak current thereby does not occur between the control circuit 1A and the photodiode UV-PD.

The main portions of the MOSFET (source, drain and channel regions) are also formed in the silicon semiconductor layer 18 above the silicon oxide insulating film 16. The gate of the MOSFET is also formed in the silicon semiconductor layer 18, with the gate insulating film 60 interposed therebetween. Namely, the MOSFET is insulated from the photodiodes PD1 and PD2 by the silicon oxide insulating film 16, the LOCOS oxide film 19, and the gate insulating film 60. Leak current thereby does not occur between the photodiodes PD1 and PD2 and the MOSFET (namely the control circuit 11A).

Fabricating Processes of the Light Sensor

Explanation will now be given of the fabricating processes of the light sensor of the present invention, with reference to FIG. 14 to FIG. 19. Since in the second exemplary embodiment the photodiodes PD1, PD2 and UV-PD and the MOSFET are each shown on a single cross-section (FIG. 11), the second exemplary embodiment will be employed in the explanation of the fabricating processes of the present invention. The light sensor according to the first exemplary embodiment can be fabricated by a similar method. It should be noted that the light sensor of the present invention is not limited to one fabricated by these fabricating processes, and may be fabricated by suitable combinations of existing semiconductor processes.

Figure 14A:
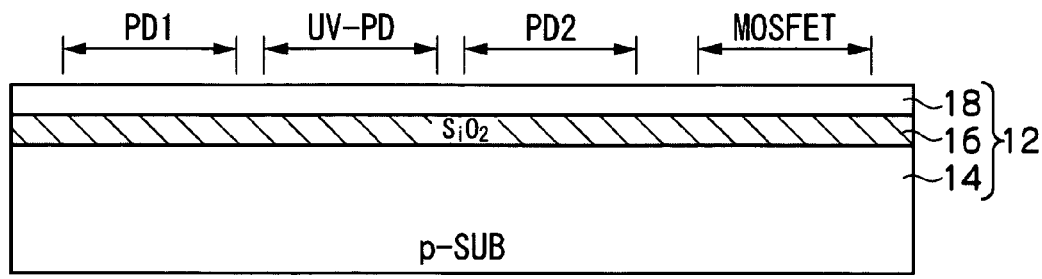
FIG. 14A to FIG. 14E are process diagrams for explaining the fabricating processes of the light sensor of the present invention.

First, as shown in FIG. 14A, the SOI substrate 12 is prepared by forming the silicon oxide ($SiO_2$) insulating film 16, and a silicon semiconductor layer 18 formed from single crystal silicon of 50 nm thickness, on the silicon substrate 14. Known methods for fabricating a SOI substrate can be employed for the SOI substrate 12, including SIMOX methods, bonding methods etc. Explanation is given here of an example in which a SOI substrate 12 formed with a silicon semiconductor layer 18 of 50 nm thickness is used. However the thickness of the silicon semiconductor layer 18 can be within the range of 40 nm to 100 nm. It should be noted that each of the forming regions in the SOI substrate 12 for the photodiodes PD1, PD2 and UV-PD and the MOSFET are set in advance.

Figure 14B:
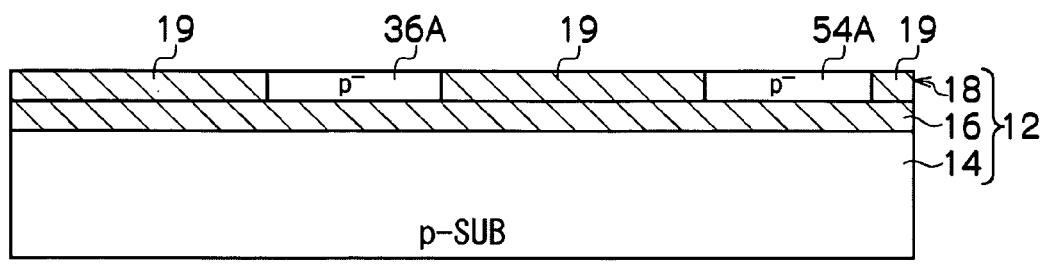

Next, as shown in FIG. 14B, portions of the silicon semiconductor layer 18 other than the forming regions of the UV-PD and the MOSFET are formed with the LOCOS oxide film 19 of silicon oxide. The UV-PD and MOSFET forming regions of the silicon semiconductor layer 18 are formed with the $p^-$-type diffusion regions 36A and 54A, with a p-type impurity diffused at low concentration.

In detail, a pad oxide film of thin thickness is formed using a thermal oxidation method on the silicon semiconductor layer 18, and a silicon nitride film is formed from silicon nitride ($Si_3N_4$) by a CVD (Chemical Vapor Deposition) method on the pad oxide film. Resist mask (not illustrated) is formed by photolithography on the silicon nitride film so that regions other than the regions for forming the photodiode UV-PD and the MOSFET are exposed, and using the resist mask as a mask the silicon nitride film is removed by anisotropic etching so as to expose the pad oxide film.

After removing the resist mask, the silicon semiconductor layer 18 is oxidized using a LOCOS (Local Oxidation Of Silicon) method in regions other than the UV-PD and MOSFET forming regions, using the exposed silicon nitride film as a mask. The LOCOS oxide film 19 is formed in the silicon semiconductor layer 18 up to the silicon oxide insulating film 16. After the LOCOS oxide film 19 has been formed, the silicon nitride film and the pad oxide film is removed using wet etching.

Next, resist mask (not illustrated) is formed on the silicon semiconductor layer 18 using photolithography so that the UV-PD and MOSFET forming regions are exposed, and, using the resist mask as a mask, p-type impurity ions, such as aluminum (Al) or boron (B) etc. are implanted into the silicon semiconductor layer 18 in the exposed UV-PD and MOSFET forming regions. The $p^-$-type diffusion region 36A is formed in the silicon semiconductor layer 18 in the UV-PD forming region, and the $p^-$-type diffusion region 54A is formed in silicon semiconductor layer 18 in the MOSFET forming region. After forming the $p^-$-type diffusion region 36A and the $p^-$-type diffusion region 54A the resist mask is removed.

Figure 14C:
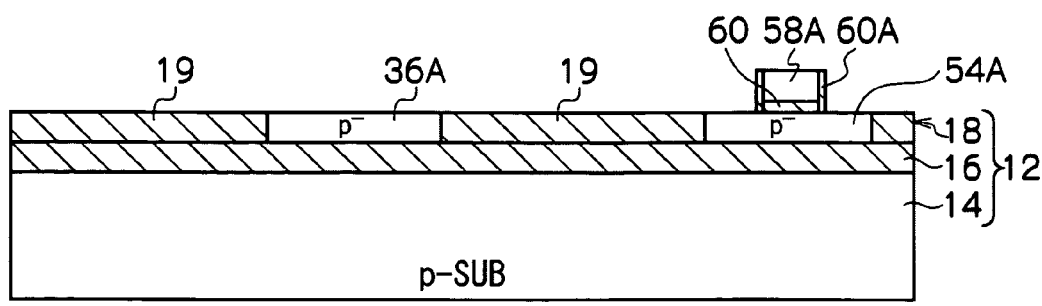

Next, as shown in FIG. 14C, a gate semiconductor layer 58A is formed above the $p^-$-type diffusion region 54A formed in the MOSFET forming region of the silicon semiconductor layer 18, the gate semiconductor layer 58A facing the silicon semiconductor layer 18 with the gate insulating film 60 interposed therebetween. Side wall insulating films 60A are also formed of silicon oxide on the side faces of the gate semiconductor layer 58A.

Specifically, a silicon oxide film is formed from silicon oxide of the oxidized top surface of the silicon semiconductor layer 18 by a thermal oxidizing method, and multi-crystalline silicon (poly-silicon) is deposited on this silicon oxide film using a CVD method, and a comparatively thick poly-silicon layer is formed. Resist mask (not illustrated) is formed on the poly-silicon layer using photolithography so as to cover the gate semiconductor layer 58A forming region present in the center portion of the MOSFET forming region on the poly-silicon layer.

Using this as a mask, the silicon semiconductor layer 18 is exposed by anisotropic etching of the poly-silicon layer and the silicon oxide film, forming the gate semiconductor layer 58A facing the silicon semiconductor layer 18 with the gate insulating film 60 interposed therebetween. After forming the gate semiconductor layer 58A, the resist mask is removed.

Next, a silicon oxide film is deposited using a CVD method on the entire area of the silicon semiconductor layer 18 formed with the gate semiconductor layer 58A. The silicon oxide film is etched using anisotropic etching to expose the top face of the gate semiconductor layer 58A and the top face of the silicon semiconductor layer 18, and the side wall insulating film 60A is formed to the side faces of the gate semiconductor layer 58A.

Figure 14D:
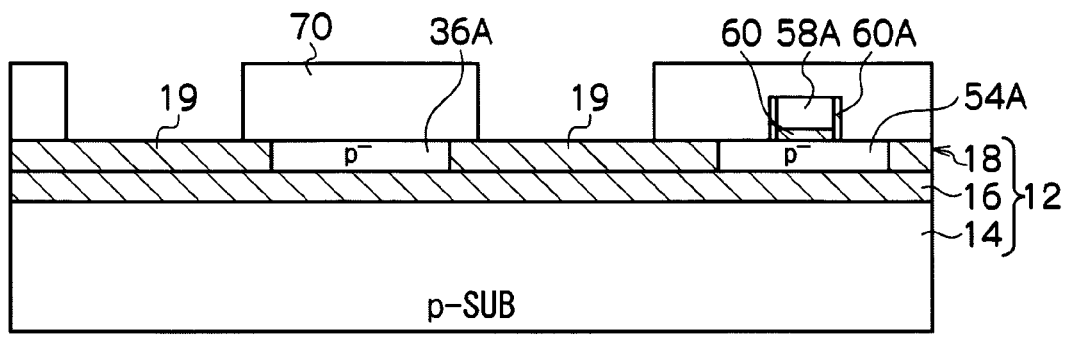
Figure 14E:
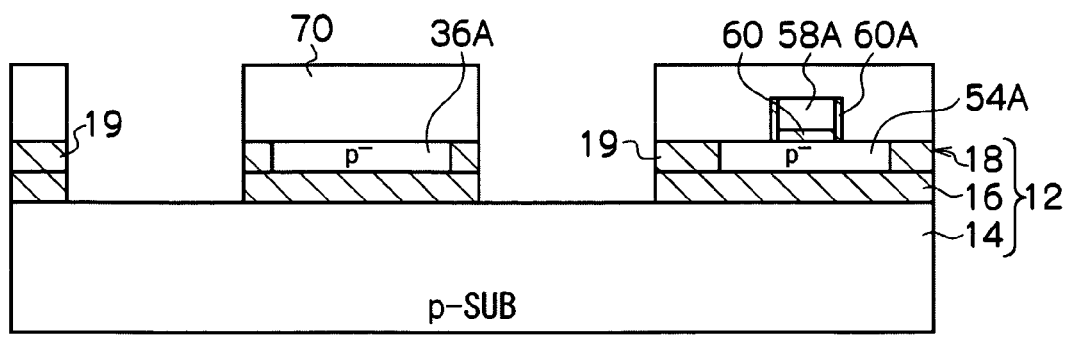

Next, as shown in FIG. 14D, a resist mask 70 is formed by photolithography on the silicon semiconductor layer 18 formed with the gate semiconductor layer 58A, with the PD1 forming region and the PD2 forming region exposed. Next, as shown in FIG. 14E, employing the resist mask 70 the LOCOS oxide film 19 and the silicon oxide insulating film 16 are etched using anisotropic etching, the p-type silicon substrate 14 of the PD1 forming region and the PD2 forming region is exposed. The resist mask 70 is then removed for the time being.

After the resist mask 70 has been removed, preferably NSG (Nondoped Silica Glass) is deposited, using a CVD method over the entire surface of the silicon semiconductor layer 18 formed with the gate semiconductor layer 58A and the exposed p-type silicon substrate 14, to form a NSG layer, serving as an insulating material layer, of a specific thickness (for example 10 nm).

Figure 15F:
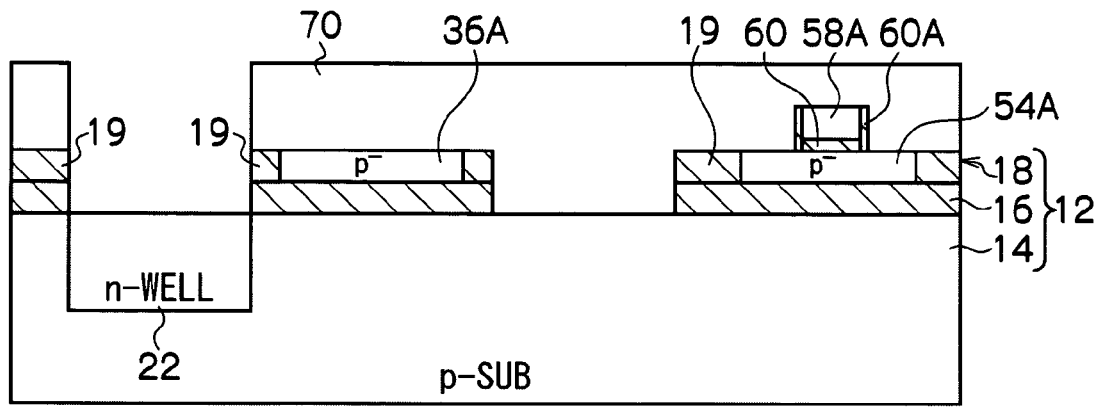
FIG. 15F to FIG. 15I are process diagrams for explaining the fabricating processes of the light sensor of the present invention.

Next, as shown in FIG. 15F, the resist mask 70 is formed by photolithography on the silicon semiconductor layer 18 formed with the gate semiconductor layer 58A and on the p-type silicon substrate 14 (referred to below as on the surface), with the p-type silicon substrate 14 of the PD1 forming region exposed. Employing the resist mask 70, an n-type impurity ions, such as phosphorous (P) or arsenic (As) etc., are implanted. The n-well 22 of the PD1 with n-type impurity diffused with low concentration is formed in the vicinity of the surface of the p-type silicon substrate 14. The n-well 22 is formed of a specific depth according to the characteristics of the PD1. For example, the depth can be made between about 1000 nm and 2500 nm. The resist mask 70 is then removed for the time being.

Figure 15G:
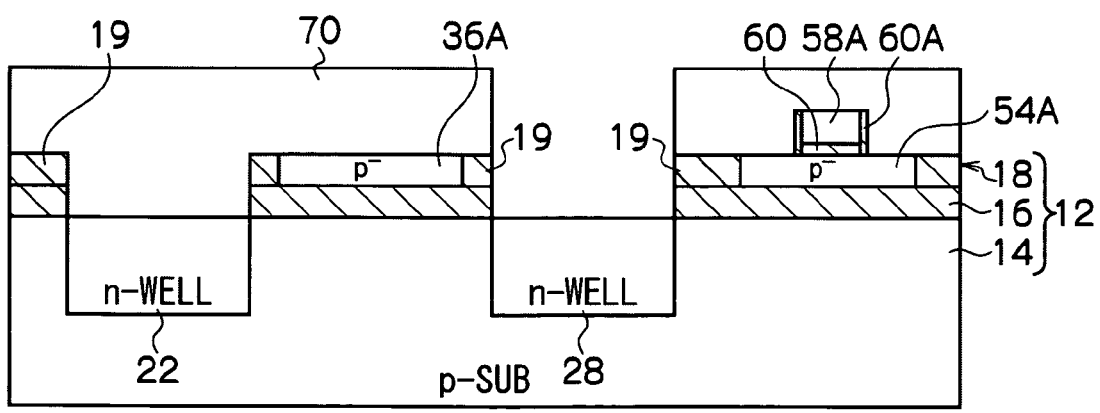

Next in a similar manner, as shown in FIG. 15G, the resist mask 70 is formed on the surface, with the p-type silicon substrate 14 of the PD2 forming region exposed. Then, employing the resist mask 70, n-type impurity ions are implanted. The n-well 28 of the PD2 with n-type impurity diffused with low concentration is formed in the vicinity of the surface of the p-type silicon substrate 14. The n-well 28 is formed of a specific depth, different to the depth of the n-well 22 of the PD1, according to the characteristics of the PD2. For example, the depth can be made between about 1000 nm and 2500 nm. The resist mask 70 is then removed for the time being.

Figure 15H:
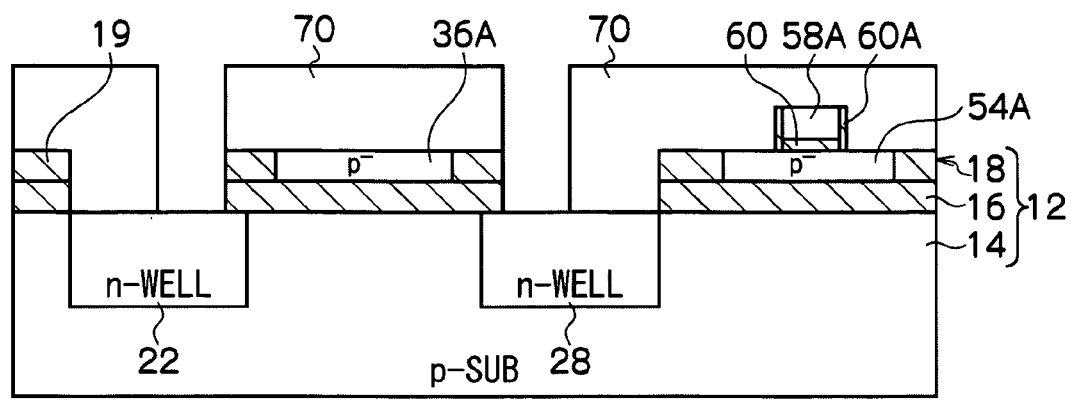
Figure 15I:
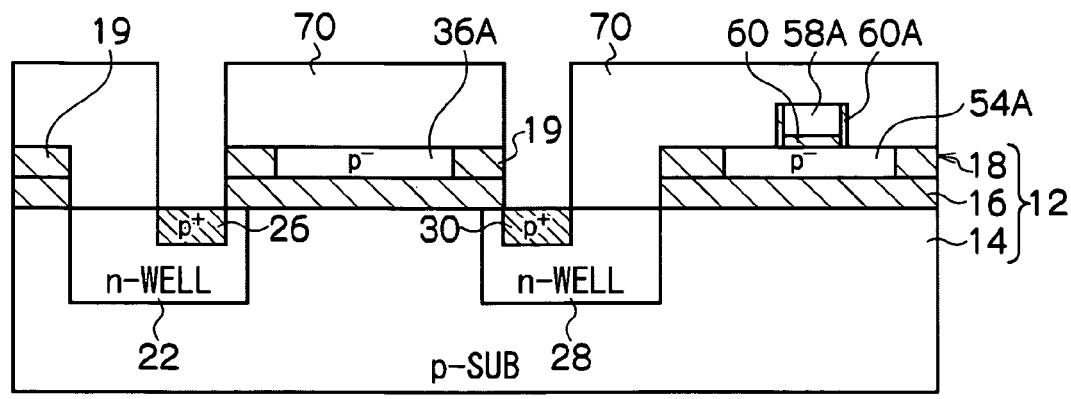

Next, as shown in FIG. 15H, the resist mask 70 is formed by photolithography on the surface, with the surface of the n-well 22 corresponding to the $p^+$-type diffusion region 26, and the surface of the n-well 28 corresponding to the p⁺-type diffusion region 30, exposed. Next, as shown in FIG. 15I, p-type impurity ions are implanted employing the resist mask 70. The p⁺-type diffusion region 26 is formed with p-type impurities diffused at high concentration in the vicinity of the surface of the n-well 22, and the p⁺-type diffusion region 30 is formed with p-type impurities diffused at high concentration in the vicinity of the surface of the n-well 28. The resist mask 70 is then removed for the time being. It should be noted that the depth of the diffusion region within the n-well 22 can be made, for example, about 200 nm to 500 nm.

Figure 16J:
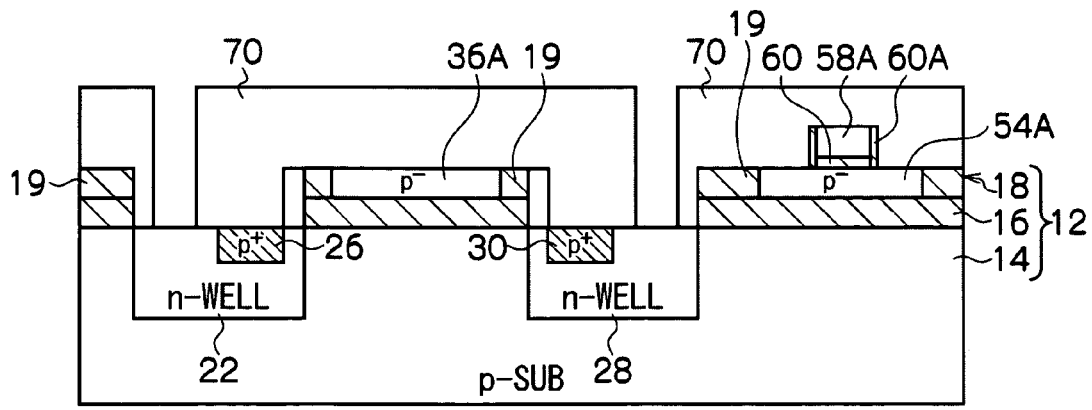
FIG. 16J to FIG. 16L are process diagrams for explaining the fabricating processes of the light sensor of the present invention.
Figure 16K:
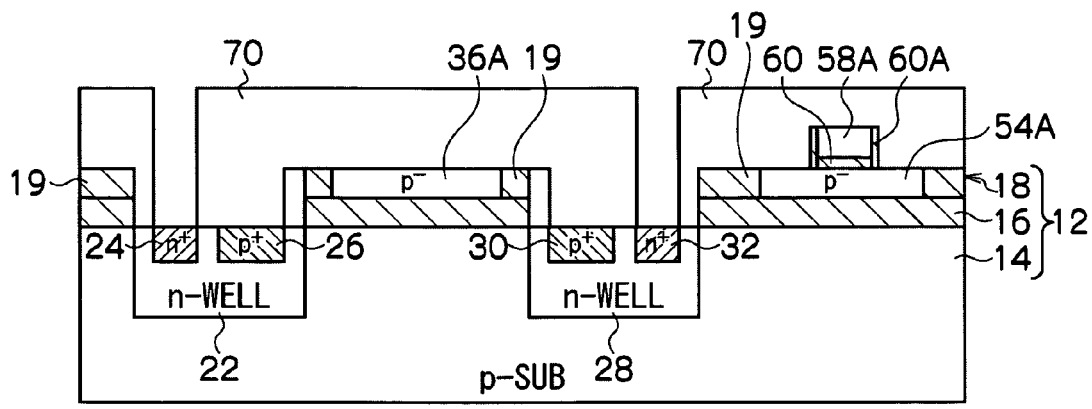

Next, as shown in FIG. 16J, the resist mask 70 is formed by photolithography on the surface, with the surface of the n-well 22 corresponding to the n⁺-type diffusion region 24, and the surface of the n-well 28 corresponding to the n⁺-type diffusion region 32, exposed. Next, as shown in FIG. 16K, n-type impurity ions are implanted in two successive stages employing the resist mask 70. The n⁺-type diffusion region 24 is formed with n-type impurities diffused at high concentration in the vicinity of the surface of the n-well 22, and n⁺-type diffusion region 32 is formed with n-type impurities diffused at high concentration in the vicinity of the surface of the n-well 28. The resist mask 70 is then removed for the time being. It should be noted that the depth of the diffusion region within the n-well 28 can be made, for example, about 200 nm to 500 nm.

Figure 16L:
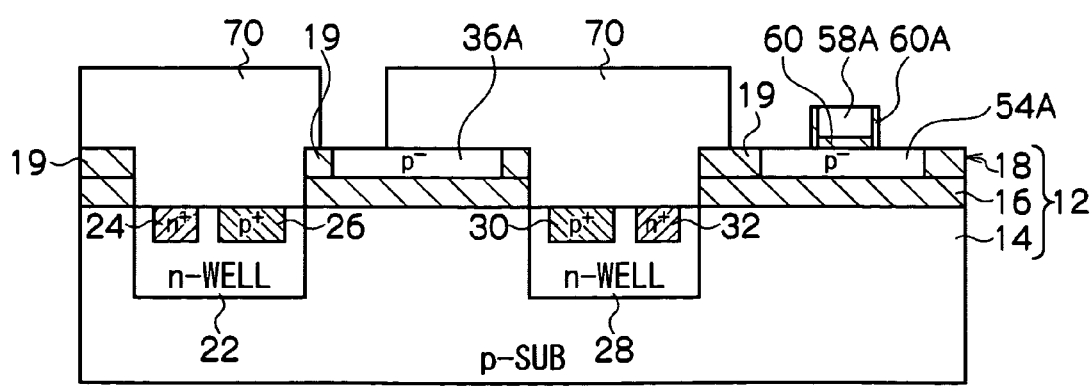

Next, as shown in FIG. 16L, the resist mask 70 is formed by photolithography on the silicon semiconductor layer 18 formed with the gate semiconductor layer 58A, with the surface of the p⁻-type diffusion region 36A corresponding to the n⁺-type diffusion region 34 of the UV-PD exposed, the surface of the gate semiconductor layer 58A corresponding to the gate 58 of the MOSFET exposed, and the surface of the p⁻-type diffusion region 54A corresponding to the source 52 and the drain 56 of the MOSFET exposed.

Figure 17M:
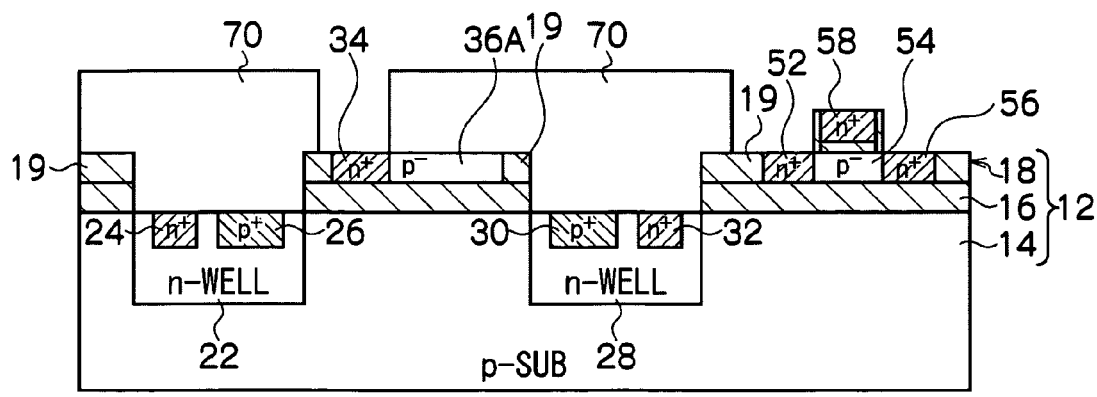
FIG. 17M to FIG. 17O are process diagrams for explaining the fabricating processes of the light sensor of the present invention.

Next, as shown in FIG. 17M, n-type impurity ions are implanted employing the resist mask 70. The n⁺-type diffusion region 34 of the UV-PD is formed with n-type impurities diffused at high concentration in p⁻-type diffusion region 36A. The gate 58 is formed as an n⁺-type diffusion region with n-type impurities diffused at high concentration in the gate semiconductor layer 58A. The source 52 is formed as an n⁺-type diffusion region with n-type impurities diffused at high concentration, and the drain 56 is formed as an n⁺-type diffusion region with n-type impurities diffused at high concentration, in the p⁻-type diffusion region 54A. The region directly below the gate semiconductor layer 58A is left unchanged as a p⁻-type diffusion region, becoming the channel region 54 formed from a p⁻-type diffusion region. The resist mask 70 is then removed for the time being.

Figure 17N:
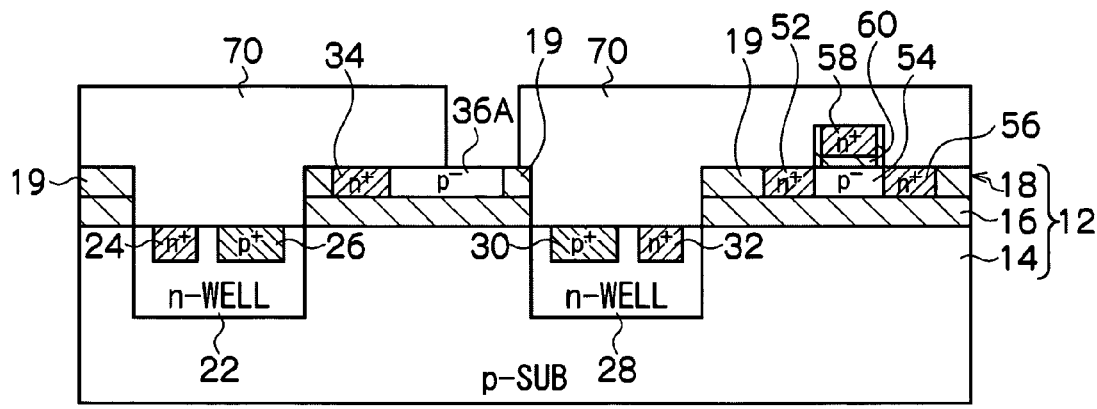
Figure 17O:
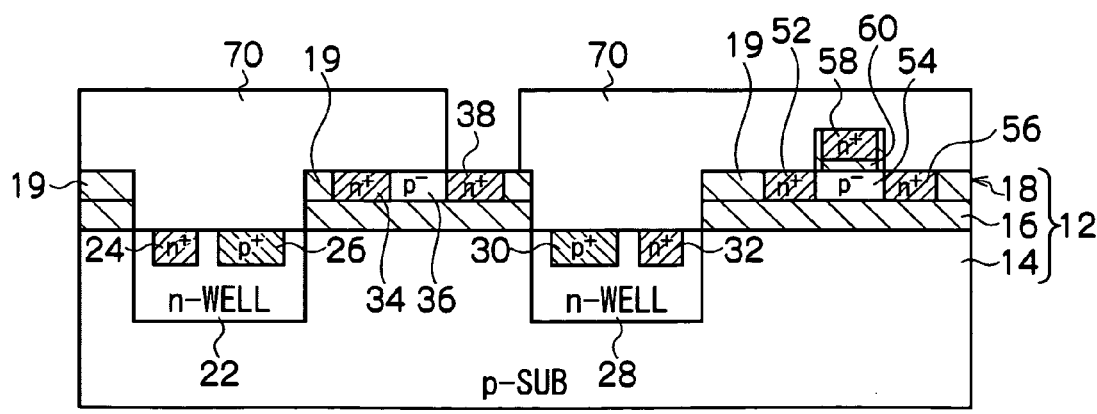

Next, as shown in FIG. 17N, the resist mask 70 is formed by photolithography on the silicon semiconductor layer 18, with the surface of the p-type diffusion region 36A corresponding to the p⁺-type diffusion region 38 of the UV-PD exposed. Next, as shown in FIG. 17O, p-type impurity ions are implanted while employing the resist mask 70. The p⁺-type diffusion region 38 of the UV-PD is formed in the p⁻-type diffusion region 36A as a region in which p-type impurities are diffused at high concentration. The remaining regions of the p⁻-type diffusion region 36A become the p⁻-type diffusion region 36 of the UV-PD. The resist mask 70 is then removed for the time being.

Figure 18P:
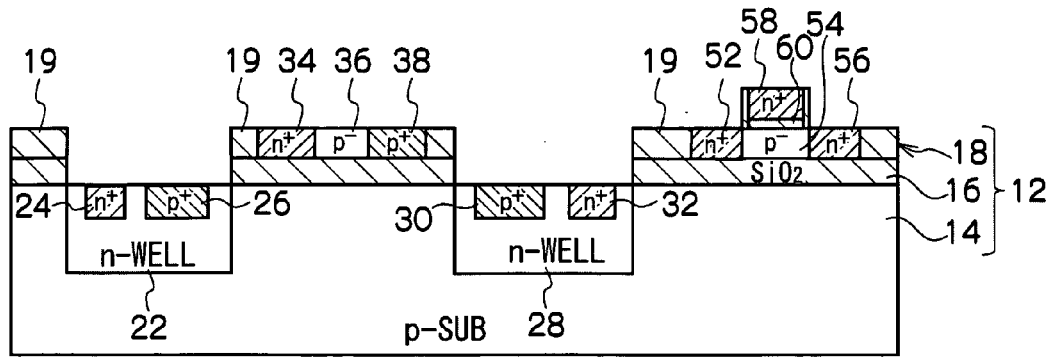
FIG. 18P to FIG. 18R are process diagrams for explaining the fabricating processes of the light sensor of the present invention.

Next, as shown in FIG. 18P, the resist mask 70 is removed for the time being. After the resist mask 70 has been removed, the impurities implanted into each of the injection layers are activated by high temperature heat treatment, diffusing the specific types of impurities and specific concentrations thereof in each of the diffusion layers. The photodiodes PD1, PD2, UV-PD and MOSFET are thereby formed by each of the respective impurity dispersed regions.

It should be noted that after heat treatment, preferably the resist mask is formed once again with the p⁻-type diffusion region 36 of the UV-PD exposed, and the silicon semiconductor layer 18 is etched by anisotropic etching, further thinning the film of the p⁻-type diffusion region 36. When the thickness of the silicon semiconductor layer 18 is in the range of from 40 nm to 100 nm, the p⁻-type diffusion region 36 is preferably thinned to a film thickness in the range of 3 nm to 36 nm. For example, the film thickness can be thinned down to 30 nm.

Also, when a NSG layer (not illustrated) has been formed in the step of FIG. 15E, after forming the NSG layer on the thinned p⁻-type diffusion region 36, the NSG layer of the UV-PD and the MOSFET forming regions is removed by anisotropic etching while leaving the NSG layer on the p⁻-type diffusion region 36.

The surface of the n⁺-type diffusion region 34 and the p⁺-type diffusion region 38 of the UV-PD, and the surface of the source 52, the drain 56 and the gate 58 of the MOSFET, can be formed with a layer of a silicidable material (for example cobalt) using a sputtering method, and a silicide layer (not illustrated) can be formed on each of the diffused layers by silicide processing including RTA (Rapid Thermal Annealing).

Figure 18Q:
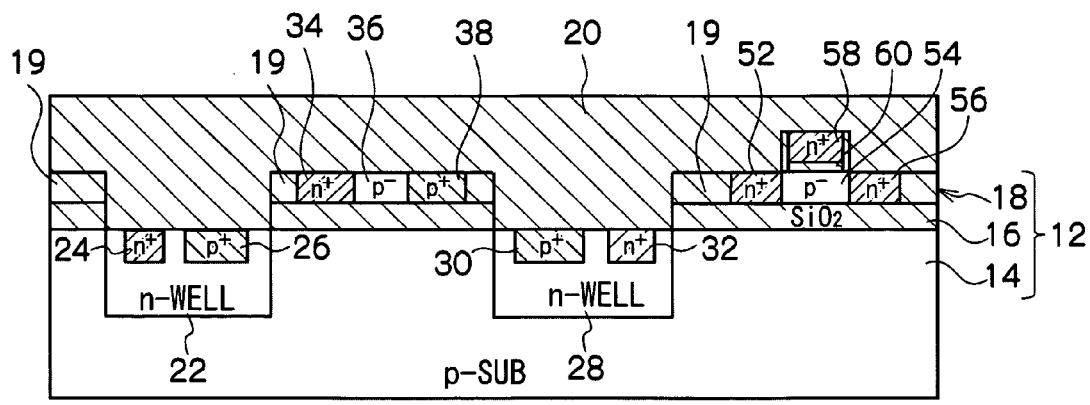

Next, as shown in FIG. 18Q, a relatively thick NSG is deposited using a CVD method over the entire surface of the silicon substrate 14 and the silicon semiconductor layer 18 formed with the photodiodes PD1, PD2, UV-PD and MOSFET, the top surface thereof is subjected to planarizing processing and the planarization film 20 is formed. The light receiving face of the light sensor is thereby covered in a transparent flattened insulating layer. The next FIG. 18R and FIG. 19 show the insulating films as integrated together.

Figure 18R:
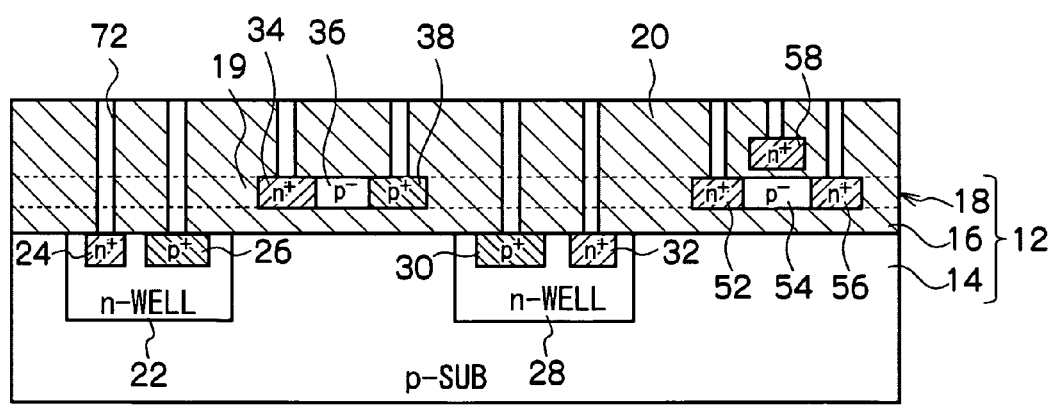

Next, as shown in FIG. 18R, contact holes 72 are formed in the planarization film 20. A resist mask for contact holes is formed on the planarization film 20 using photolithography. Each of the contact holes 72 are then formed, by anisotropic etching employing the resist mask, so as to pass through the planarization film 20, and to reach each of the diffused layers, these being the n⁺-type diffusion region 24 and the p⁺-type diffusion region 26 of the PD1, the n⁺-type region 32 and the p⁺-type diffusion region 30 of the PD2, the n⁺-type diffusion region 34 and the p⁺-type diffusion region 38 of the UV-PD, and the source 52, the drain 56, and the gate 58 of the MOSFET. The resist mask is removed after forming the contact holes 72.

Figure 19:
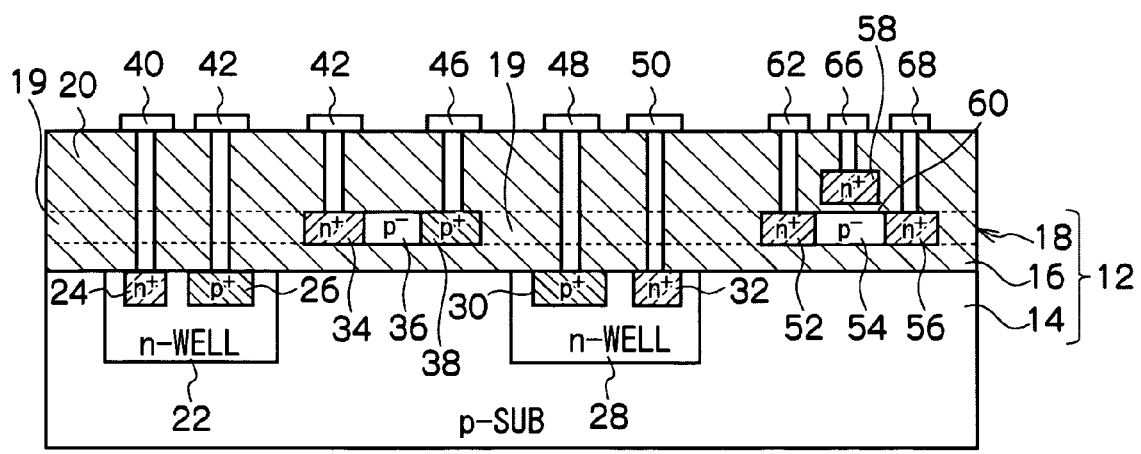
FIG. 19 is a process diagram for explaining the fabricating processes of the light sensor of the present invention.

Next, as shown in FIG. 19, a conductive material is filled into each of the contact holes 72 using a CVD method or a sputtering method. The top surface of the filled conductive material is subjected to planarizing processing, the top face of the planarization film 20 exposed, and the electrodes 40, 42, 44, 46, 48, 50, 62, 66, and 68 completed. The wiring layer (not illustrated) is formed with a conductive material on the planarization film 20 using a CVD method or sputtering method, and wirings (not illustrated) of a specific pattern are formed in the wiring layer by photolithography and etching.

By the above processes, a so-called "photo IC" is fabricated, a single chip formed on a SOI substrate with a photodiode array, of photodiodes PD1, PD2 and UV-PD arrayed in either a straight line or in an L-shape, and a control circuit for controlling each of the photodiodes.

Exemplary Modifications

In the above exemplary embodiments explanation has been given of light sensors using 3 types of photodiodes: a standard silicon photodiode PD1 with no spectral sensitivity correction; a photodiode PD2 with sensitivity to infrared light; and a photodiode UV-PD with sensitivity to ultraviolet light, with the plural photodiodes using a SOI structure. However, the sensitivity characteristics of each of the photodiodes are not limited thereto as long as they are disposed such that no leak current occurs between the photodiodes.

For example, each of the photodiode PD1 and the photodiode PD2 can be selected from photodiodes with visible light sensitivity, standard silicon photodiodes with no spectral sensitivity correction, and photodiodes having sensitivity to infrared light, to form a suitable combination of photodiodes. However, the photodiode disposed on the insulating film is preferably a photodiode with sensitivity to short wavelength light, such as blue light, ultraviolet light etc.

For example, photodiodes may be disposed with a photodiode having sensitivity to red colored light (R light) as the photodiode PD1, a photodiode having sensitivity to green colored light (G light) as the photodiode PD2, a photodiode having sensitivity to blue colored light (B light) in place of the photodiode UV-PD. By configuring such that R light, G light and B light can be separately detected in this manner, application to color solid state image capture elements becomes possible.

Also, explanation has been given in the above exemplary embodiments of three individual photodiodes of the photodiode PD1, the photodiode PD2, and the photodiode UV-PD arrayed in photodiode array of a single dimensional shape or in an L-shape, however there is no limitation to such disposed configurations. It is sufficient for plural photodiodes using a SOI structure to be disposed such that no leak current occurs between photodiodes.

Figure 22A:
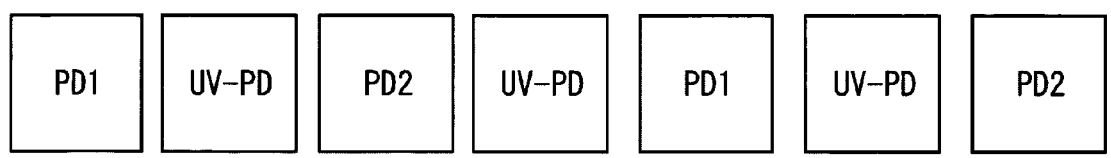
FIG. 22A is a schematic plan view showing an example of another disposition layout of photodiodes.

For example, as shown in FIG. 22A, configuration may be made with the photodiodes PD1 or PD2, alternately arrayed with the photodiode UV-PD. In such cases too, the photodiode PD1 and PD2 are disposed with the photodiode UV-PD interposed therebetween, and separated with sufficient separation distance, therefore leak current does not occur between the two photodiodes. The photodiode UV-PD is also insulated with the insulating film, and leak current does not occur between the photodiodes PD1 and PD2 and the photodiode UV-PD.

Figure 22B:
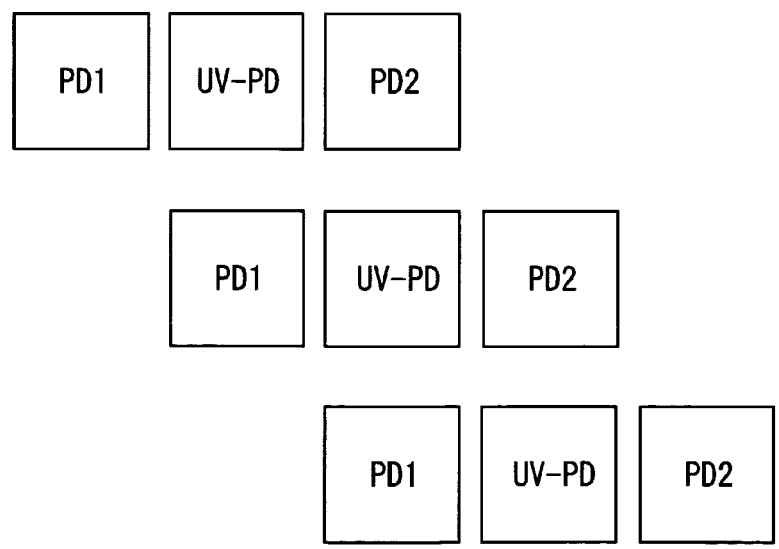
FIG. 22B is a schematic plan view showing an example of another disposition layout of photodiodes.

In addition, as shown in FIG. 22B, plural photodiode rows, made up from a photodiode PD1, a photodiode UV-PD, and a photodiode PD2 arrayed in a single dimensional shape, can be arrayed in a staggered pattern. Namely, plural photodiodes may be arrayed in a two dimensional shape. In such cases too, the photodiodes PD1 and PD2 are disposed in each of the column direction and the row direction with the photodiode UV-PD interposed therebetween, and leak current does not occur between photodiodes. However, it is desirable for the photodiode rows to be disposed with sufficient separation between the photodiode rows such that leak current does not occur between the photodiodes PD1 and PD2 of adjacent photodiode rows.

In addition, explanation has been given in the above exemplary embodiments of cases in which a photodiode array is configured to obtain a light sensor equipped with spectral sensitivity characteristics that substantially match human spectral sensitivity, however if the technology of the present invention is applied to plural light receiving elements on a SOI substrate, light sensors can be configured with other wavelength sensitivities. For example, if a light receiving element array is formed with plural light receiving elements, having sensitivities to different wavelength bands, on the same substrate, then a light sensor can be fabricated for an UV sensor or for an infrared light sensor by performing appropriate computational processing based on each of the output currents of the plural light receiving elements.

In addition, an example has been explained in the above exemplary embodiments where pn junction photodiodes are used as the light receiving elements, however another light receiving element that can use a SOI structure may be used, such as employing other photodiodes, such as a pin photodiode etc., and photo transistors etc. as the light receiving elements.

Thus, the breadth and scope of the present invention should not be limited by any of the above-described exemplary embodiments, but should be defined only in accordance with the following claims and their equivalents.

What is claimed is:

1. A light sensor comprising:
a first light receiving element having sensitivity to ultraviolet light, the first light receiving element being formed on a silicon semiconductor layer of an SOI substrate provided with a silicon substrate, an insulating film formed on the silicon substrate, and the silicon semiconductor layer formed on the insulating film;
a second light receiving element having sensitivity to visible light or infrared light, the second light receiving element being formed on the silicon substrate along the surface direction of a main face of the SOI substrate in a second region that is adjacent to a first region where the first light receiving element is formed; and
a third light receiving element having sensitivity to visible light or infrared light, the third light receiving element being formed on the silicon substrate along the surface direction in a third region that is adjacent to the first region formed with the first light receiving element and that is separated by a predetermined separation distance from the second region.

2. The light sensor of claim 1, wherein the third light receiving element has sensitivity to a different wavelength of visible light or infrared light than that of the second light receiving element.

3. The light sensor of claim 1, further comprising a control circuit, for controlling each of the first light receiving element, the second light receiving element and the third light receiving element that are formed on the silicon semiconductor layer.

4. The light sensor of claim 1, wherein the first region, the second region and the third region are disposed along the surface direction in a single dimensional shape in the sequence second region, first region, third region.

5. The light sensor of claim 1, wherein the first region, the second region and the third region are disposed along the surface direction such that an array direction of the first region and the second region intersects with an array direction of the first region and the third region.

6. The light sensor of claim 3, wherein the control circuit is disposed along the surface direction at a position where a direction parallel to the array direction of the first region and the third region and passing the second region, intersects with a direction parallel to the array direction of the first region and the second region and passing the third region.

7. The light sensor of claim 6, wherein the control circuit comprises an amplifier circuit, and the amplifier circuit is disposed at a position in the control circuit that is in the vicinity of the second region and the third region.

8. The light sensor of claim 1, wherein the second region and the third region are disposed separated by a separation distance such that the leak current between the second light receiving element and the leak current is $1 \times 10^{-9}$ A or less.

9. The light sensor of claim 1, wherein the second region is separated from the third region along the surface direction by 120 μm or greater.

10. The light sensor of claim 1, wherein each of the first light receiving element, the second light receiving element, and the third light receiving element are pn junction photodiodes with a p-type diffusion region and an n-type diffusion region arrayed along the surface direction.

11. A light sensor comprising:
an SOI (silicon-on-insulator) substrate including a silicon substrate, an insulating film formed on the silicon substrate, and a silicon semiconductor layer formed on the insulating film;
a first light receiving element formed on the silicon semiconductor layer and being sensitive to ultraviolet light;
a second light receiving element formed on the silicon substrate and being sensitive to visible light or infrared light; and
a third light receiving element formed on the silicon substrate and being sensitive to visible light or infrared light, wherein
the second and third light receiving elements, in a direction parallel to a main face of the SOI substrate, are separated from each other by a predetermined distance, and are both adjacent to the first light receiving element.

* * * * *